(12) United States Patent
Masuoka et al.

(10) Patent No.: US 9,991,381 B2
(45) Date of Patent: *Jun. 5, 2018

(54) SEMICONDUCTOR DEVICE HAVING FIN-SHAPED SEMICONDUCTOR LAYER

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 8 days.

This patent is subject to a terminal disclaimer.

(21) Appl. No.: 14/797,839

(22) Filed: Jul. 13, 2015

(65) Prior Publication Data

US 2015/0318393 A1 Nov. 5, 2015

Related U.S. Application Data

(63) Continuation of application No. PCT/JP2013/066558, filed on Jun. 17, 2013.

(51) Int. Cl.
*H01L 29/76* (2006.01)
*H01L 29/78* (2006.01)
(Continued)

(52) U.S. Cl.
CPC .... *H01L 29/7827* (2013.01); *H01L 21/31051* (2013.01); *H01L 21/31055* (2013.01);
(Continued)

(58) Field of Classification Search
CPC ............. H01L 29/785; H01L 29/42392; H01L 29/66545; H01L 21/823821;
(Continued)

(56) References Cited

U.S. PATENT DOCUMENTS 9,252,190 B2 * 2/2016 Masuoka ............ H01L 27/2454
9,281,472 B2 * 3/2016 Masuoka ............ H01L 45/126
(Continued)

FOREIGN PATENT DOCUMENTS

JP H02-071556 A 3/1990
JP H02-188966 A 7/1990
(Continued)

OTHER PUBLICATIONS

English language translation of International Preliminary Report on Patentability for corresponding International Application No. PCT/JP2013/066558 dated Dec. 30, 2015, 8 pages.
(Continued)

*Primary Examiner* — Khiem D Nguyen
(74) *Attorney, Agent, or Firm* — Brinks Gilson & Lione

(57) ABSTRACT

A semiconductor-device production method includes a first step of forming a fin-shaped semiconductor layer on a semiconductor substrate and forming a first insulating film around the fin-shaped semiconductor layer, and a second step of, after the first step, forming a second insulating film around the fin-shaped semiconductor layer, depositing a first polysilicon on the second insulating film to achieve planarization, forming, in a direction perpendicular to a direction of the fin-shaped semiconductor layer, a second resist for forming a first gate line and a first pillar-shaped semiconductor layer and a third resist for forming a first contact line and a second pillar-shaped semiconductor layer, and etching the first polysilicon, the second insulating film, and the fin-shaped semiconductor layer to form the first pillar-shaped semiconductor layer, a first dummy gate formed from the first polysilicon, the second pillar-shaped semiconductor layer, and a second dummy gate formed from the first polysilicon.

6 Claims, 43 Drawing Sheets

(51) Int. Cl.
    *H01L 21/3105*     (2006.01)
    *H01L 21/3213*     (2006.01)
    *H01L 29/66*     (2006.01)
    *H01L 29/417*     (2006.01)
    *H01L 29/08*     (2006.01)
    *H01L 29/423*     (2006.01)

(52) U.S. Cl.
    CPC .... H01L 21/32133 (2013.01); H01L 29/0847 (2013.01); H01L 29/41741 (2013.01); H01L 29/42356 (2013.01); H01L 29/66545 (2013.01); H01L 29/66666 (2013.01)

(58) Field of Classification Search
    CPC ........... H01L 29/41791; H01L 27/0886; H01L 27/10826; H01L 29/7827; H01L 29/66666
    See application file for complete search history.

(56) References Cited

U.S. PATENT DOCUMENTS

| | | | | |
|---|---|---|---|---|
| 9,520,473 | B2* | 12/2016 | Masuoka | H01L 29/78 |
| 2007/0284623 | A1* | 12/2007 | Kim | H01L 27/0207 257/213 |
| 2008/0173937 | A1* | 7/2008 | Chung | H01L 29/0657 257/329 |
| 2010/0210079 | A1 | 8/2010 | Masuoka et al. | |
| 2010/0264485 | A1* | 10/2010 | Masuoka | H01L 29/42356 257/329 |
| 2010/0295135 | A1* | 11/2010 | Masuoka | H01L 27/0886 257/390 |
| 2011/0303985 | A1* | 12/2011 | Masuoka | H01L 21/84 257/369 |
| 2012/0142154 | A1 | 6/2012 | Masuoka et al. | |

FOREIGN PATENT DOCUMENTS

| | | |
|---|---|---|
| JP | H03-145761 A | 6/1991 |
| JP | H11-26726 A | 1/1999 |
| JP | 2003-163354 A | 6/2003 |
| JP | 2005-197704 A | 7/2005 |
| JP | 2009-182317 A | 8/2009 |
| WO | WO 2009/110050 A1 | 9/2009 |
| WO | WO 2013/038553 A1 | 3/2013 |
| WO | WO 2013/069102 A1 | 5/2013 |

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.

Wu et al., "High Performance 22/20nm FinFET CMOS Devices with Advanced High-K/Metal Gate Scheme", IEEE, pp. 27.1.1-27.1.4, 2010.

International Search Report and Written Opinion with English Translation for PCT/JP2013/066558 dated Aug. 13, 2013, 6 pages.

\* cited by examiner

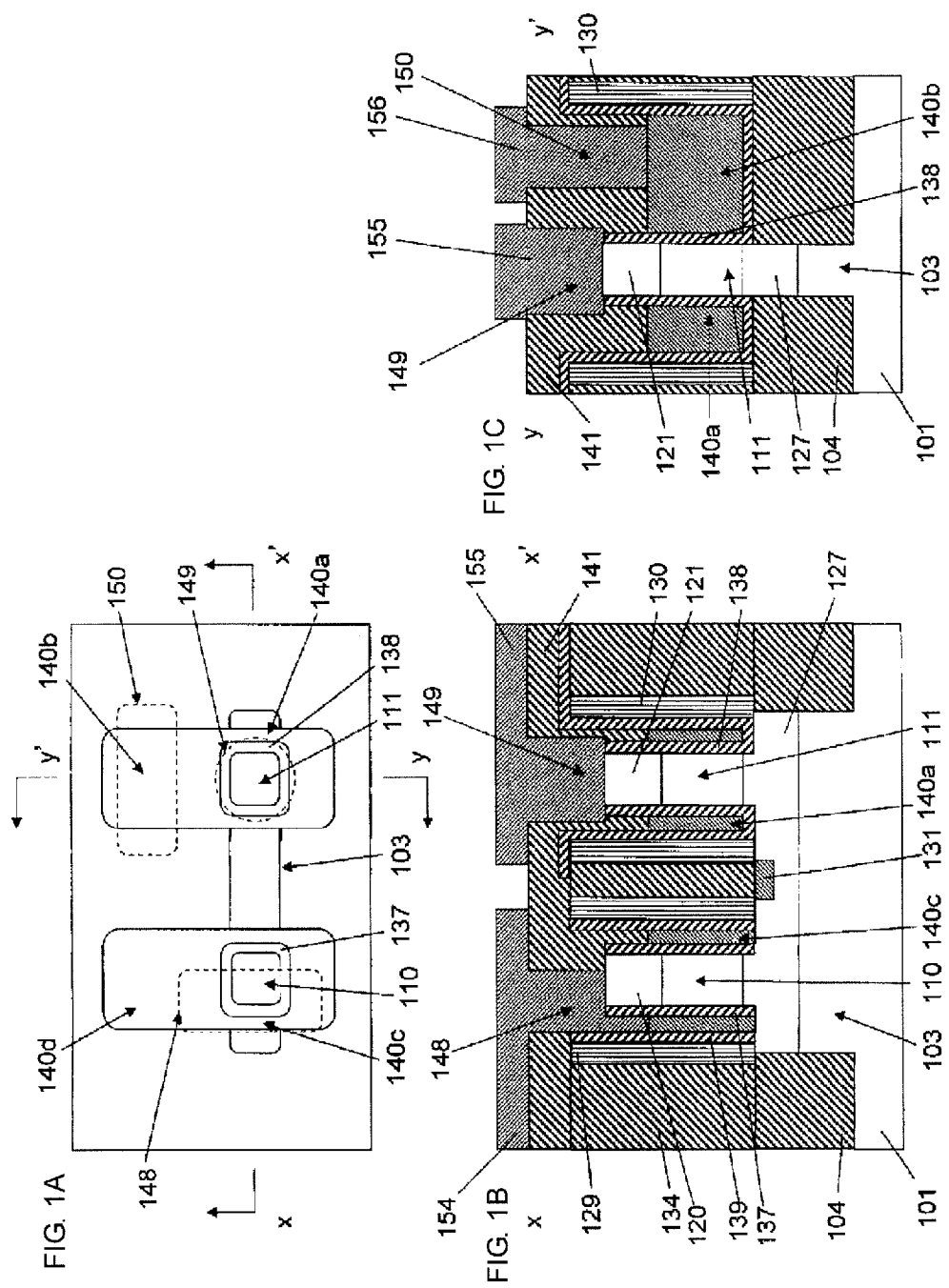

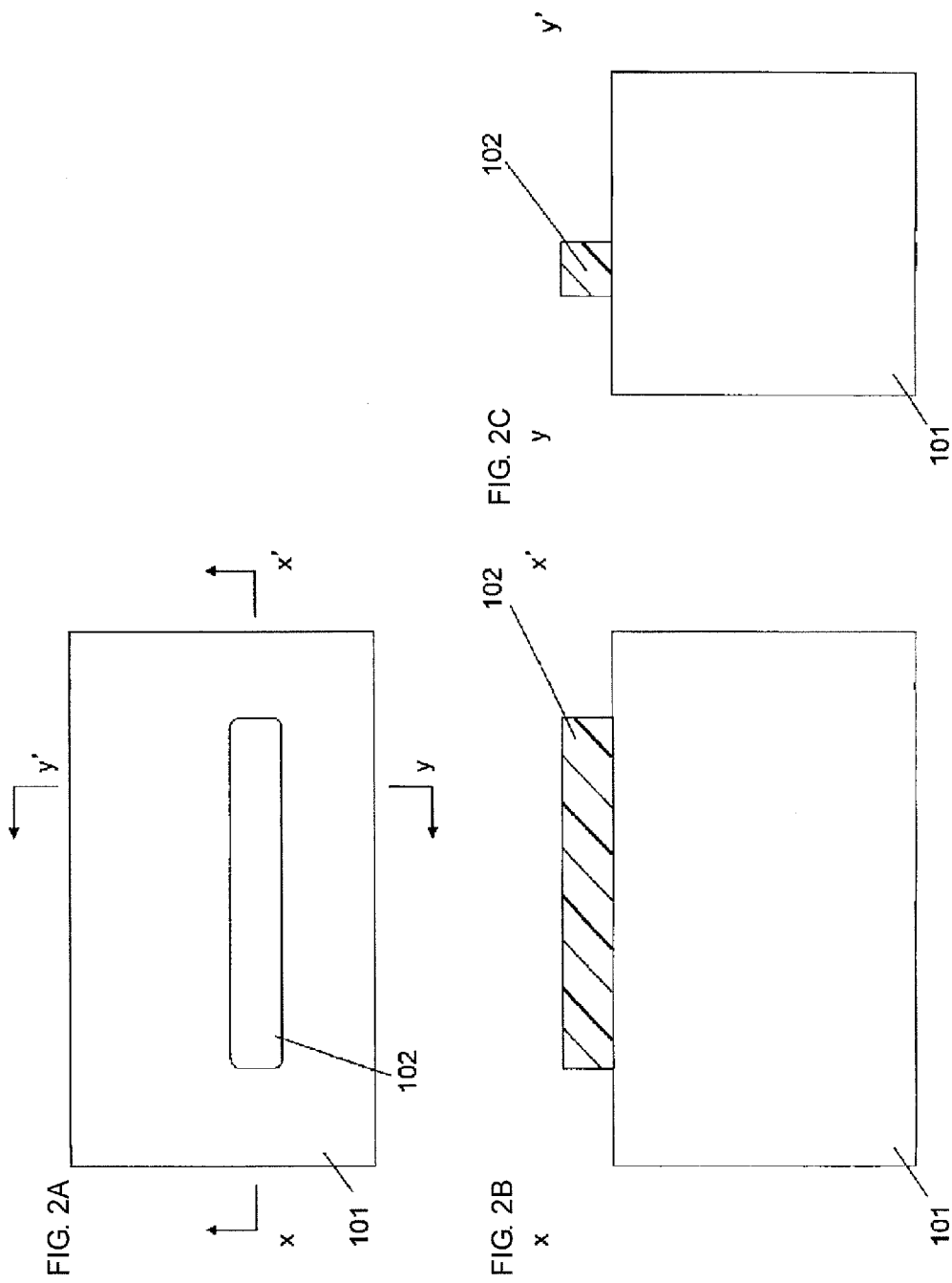

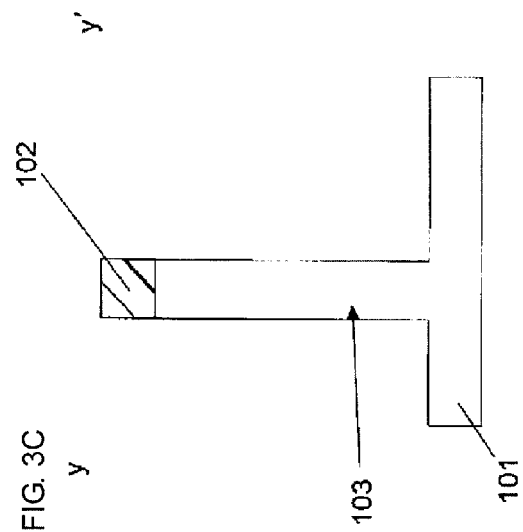
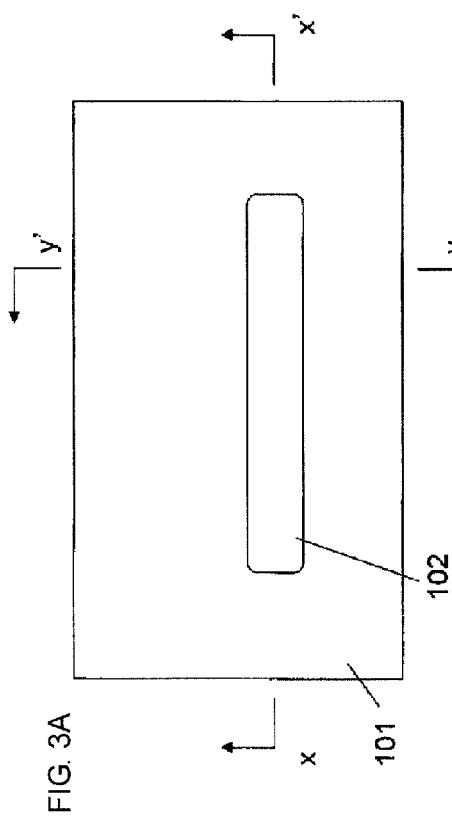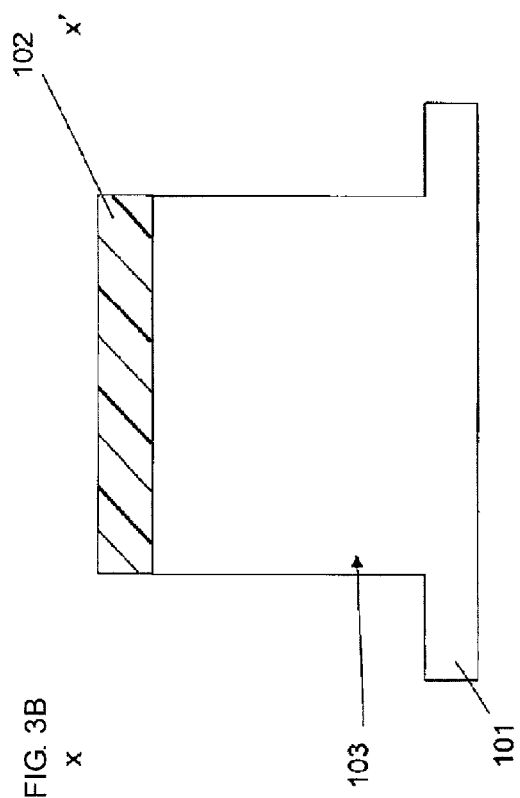

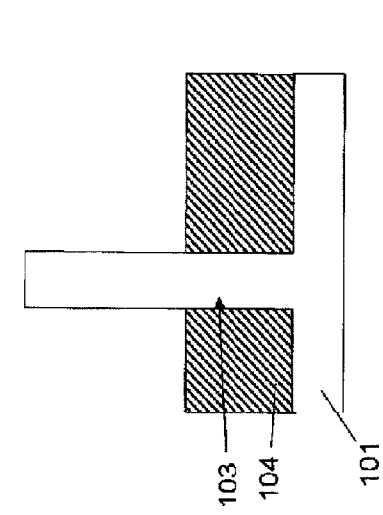
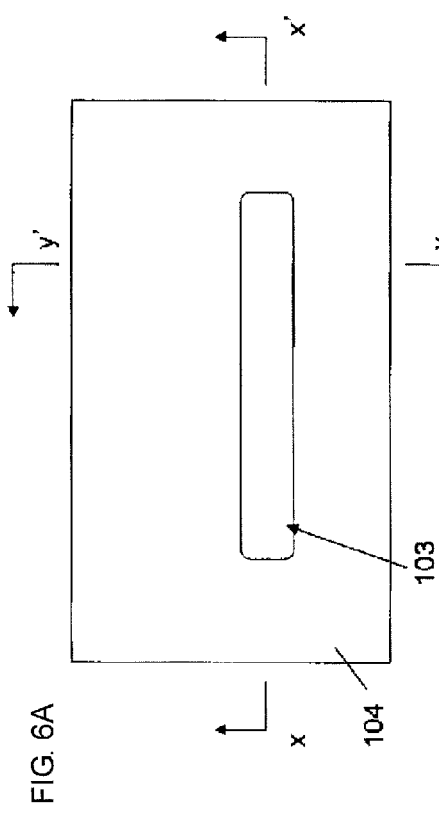
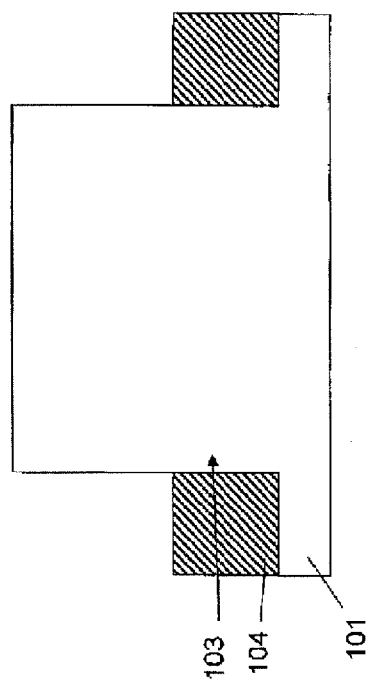

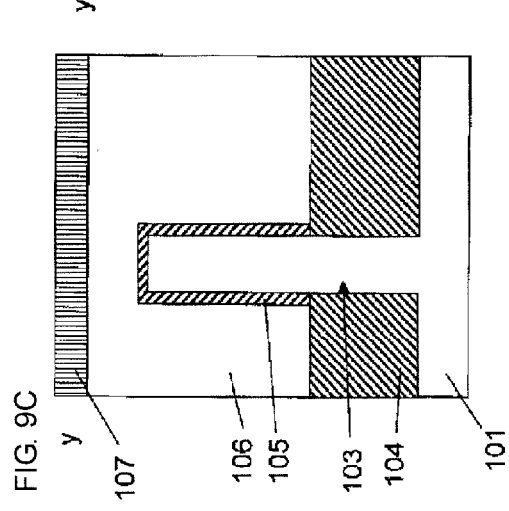
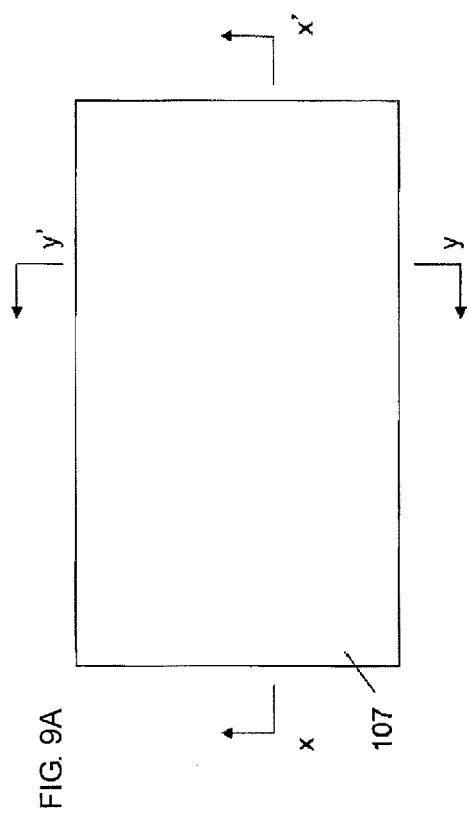
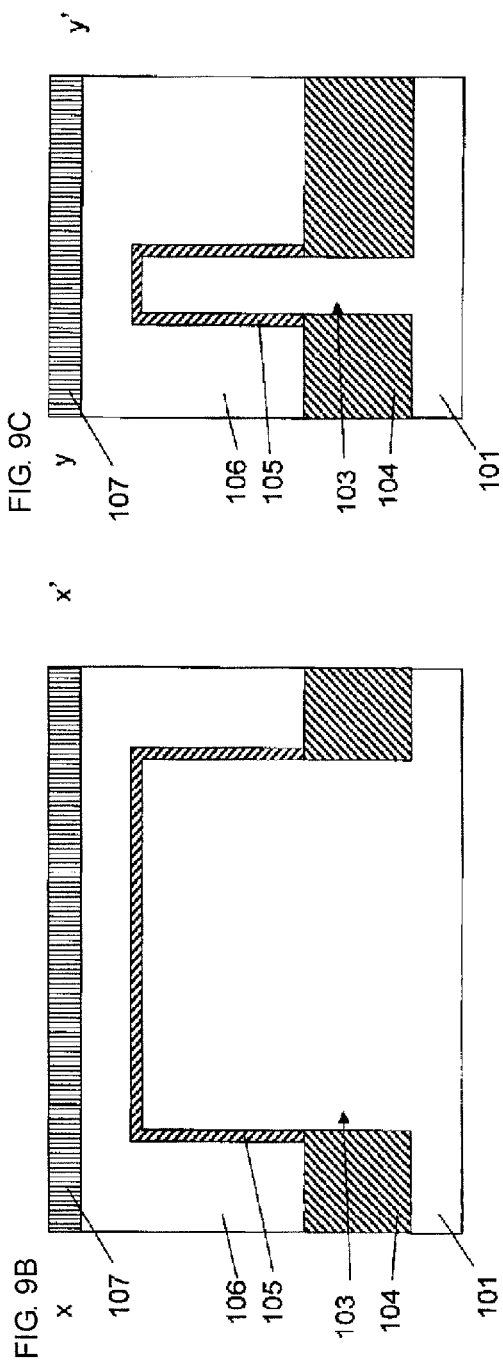

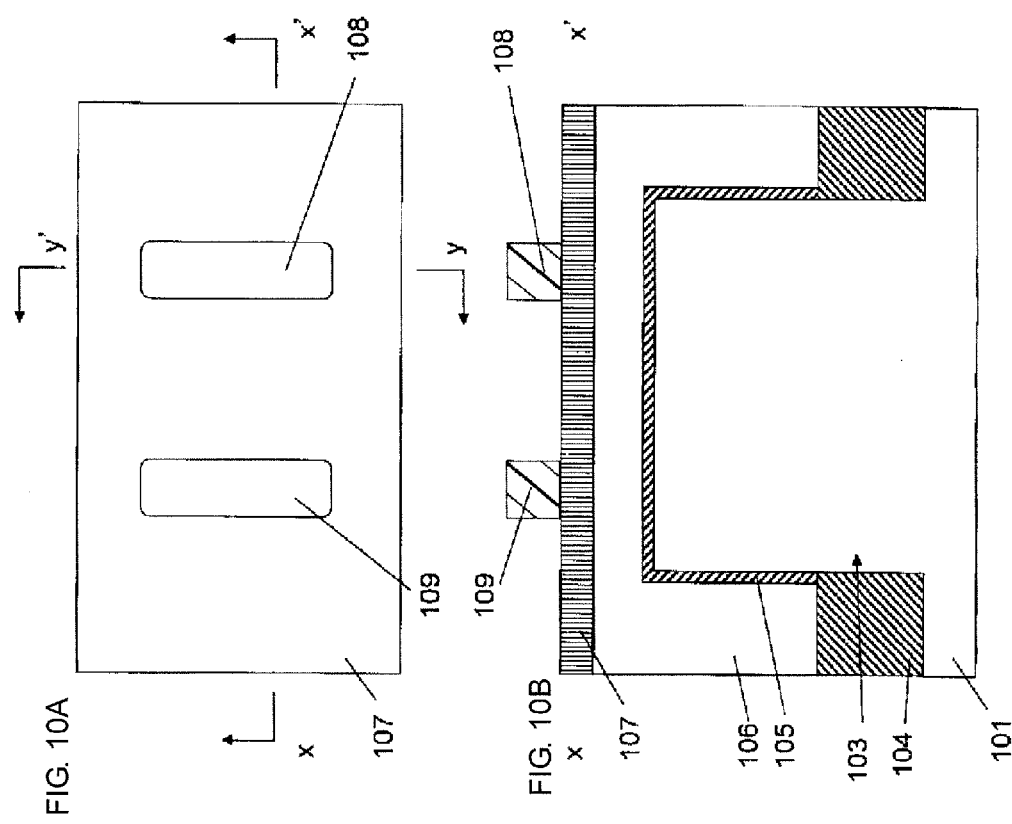

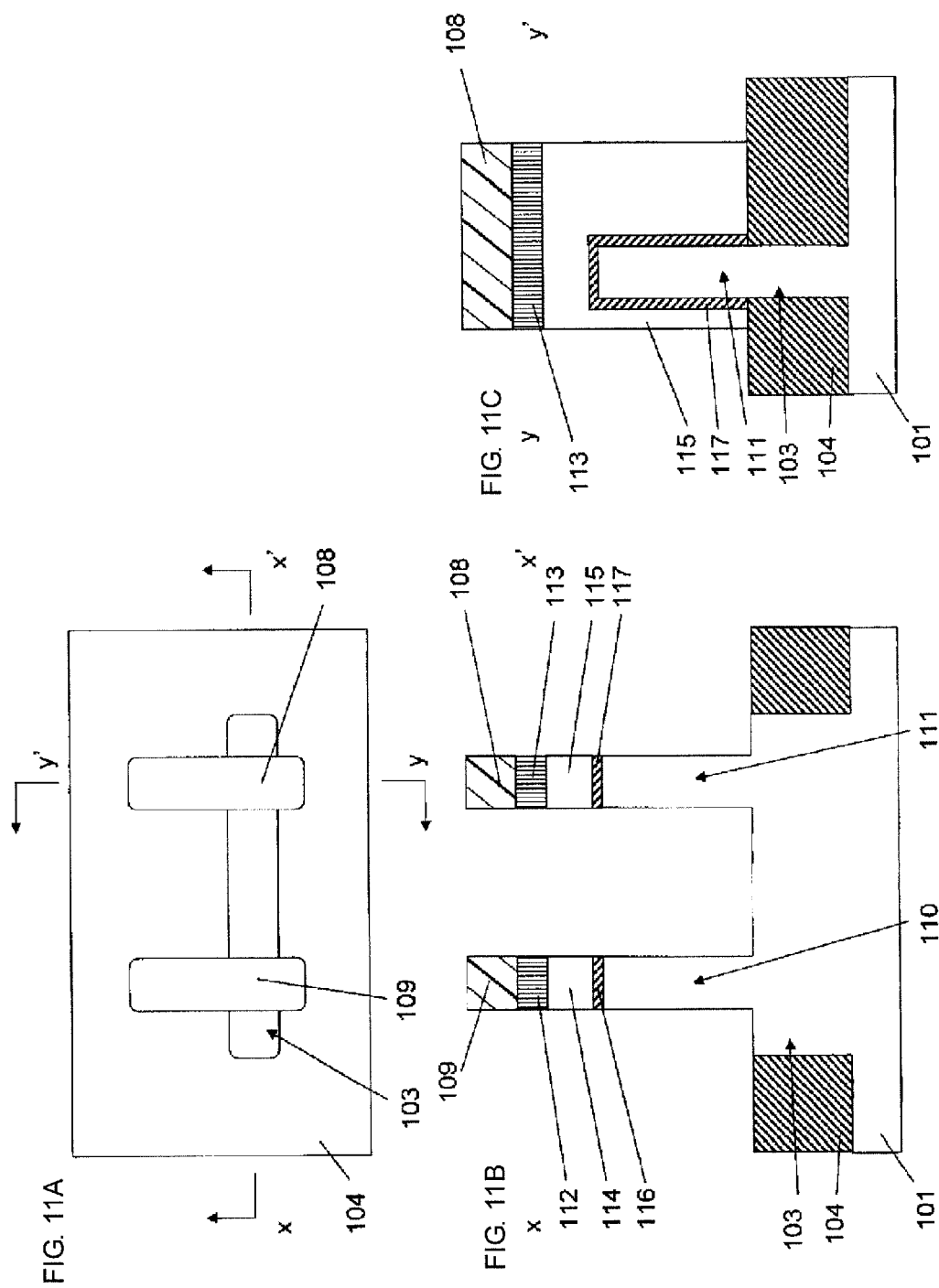

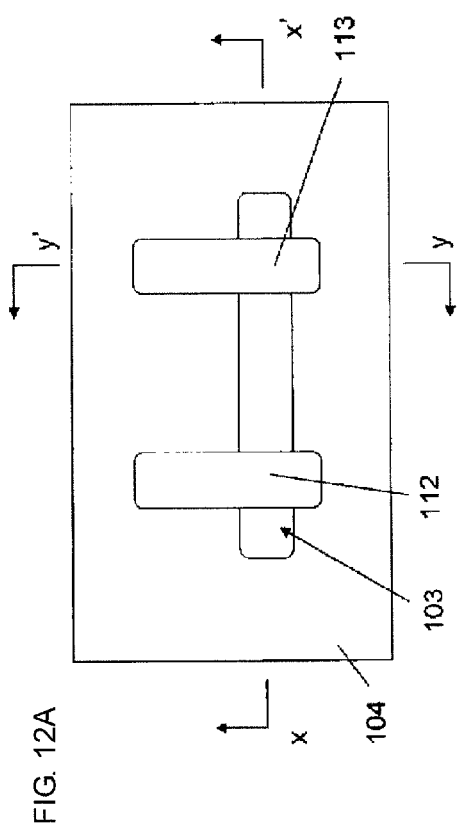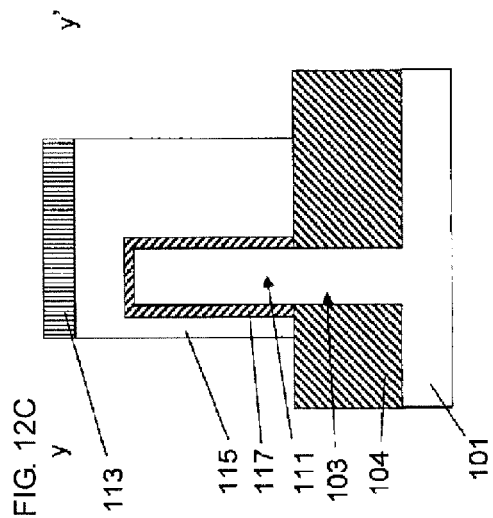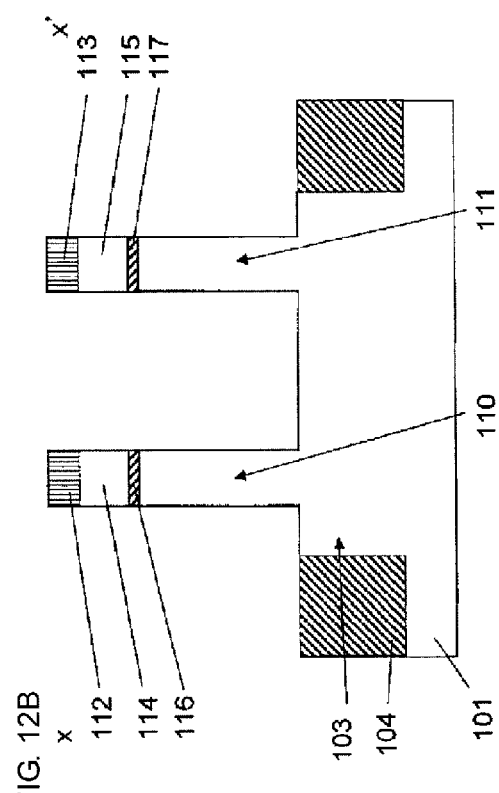

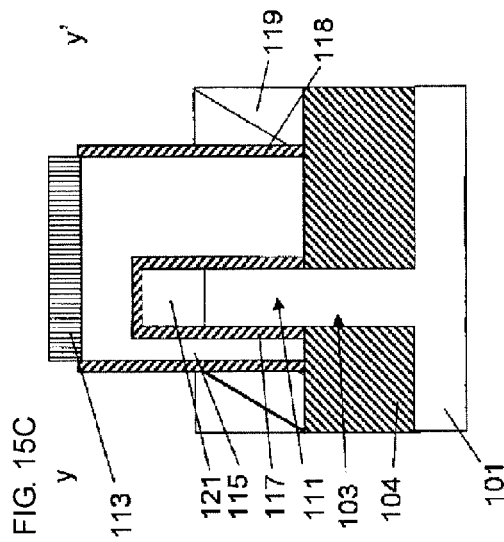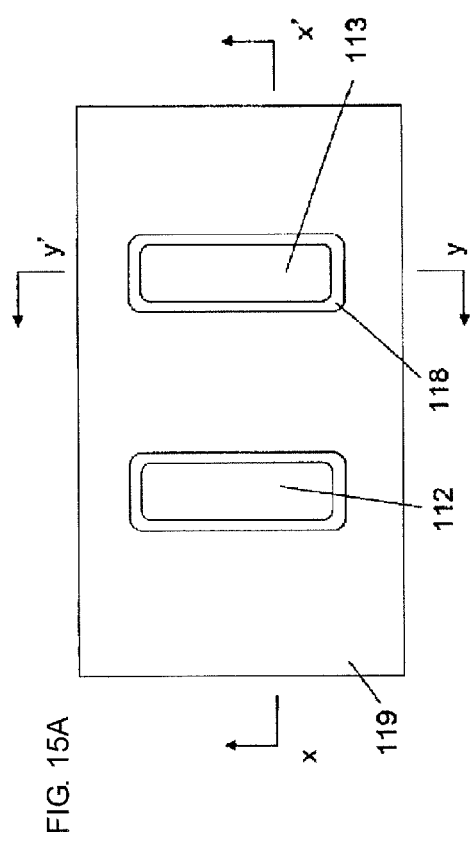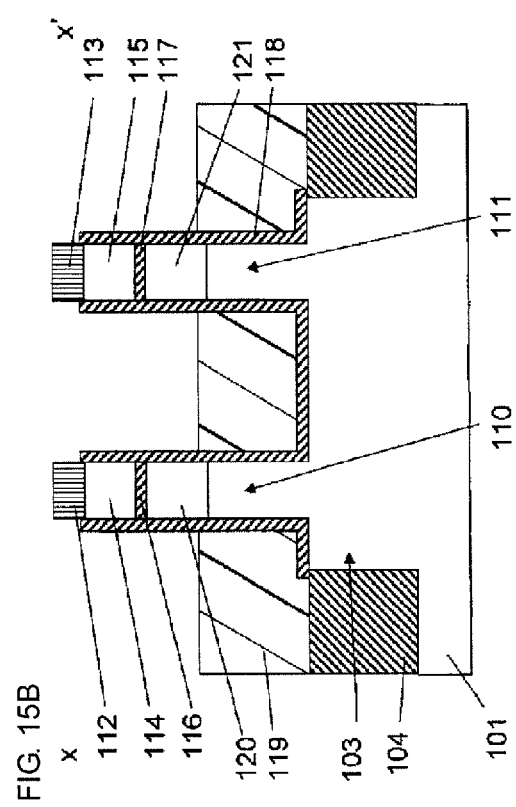

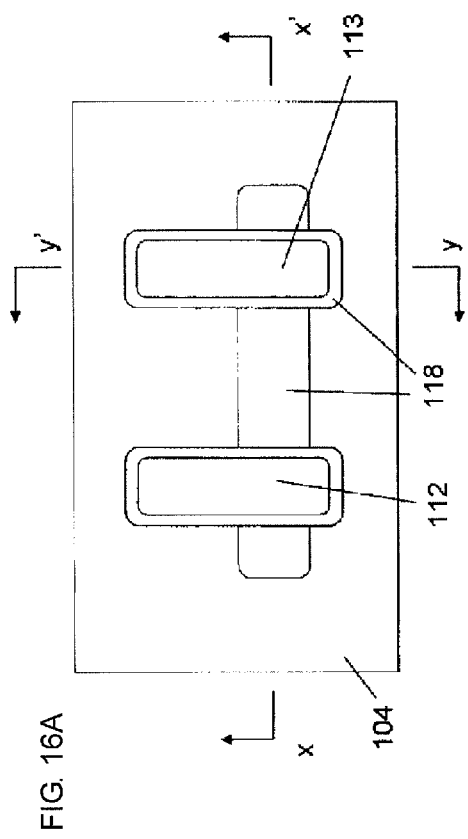
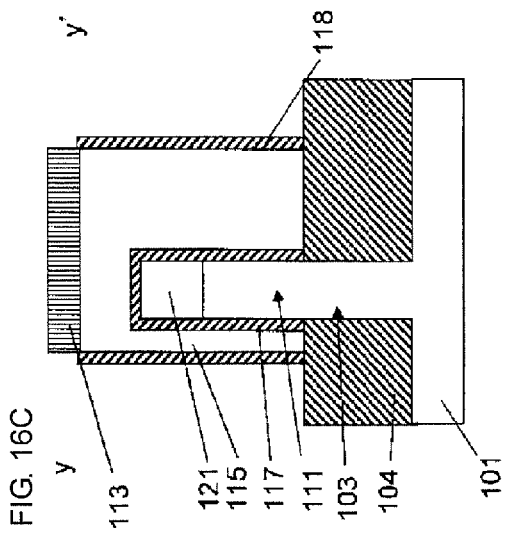
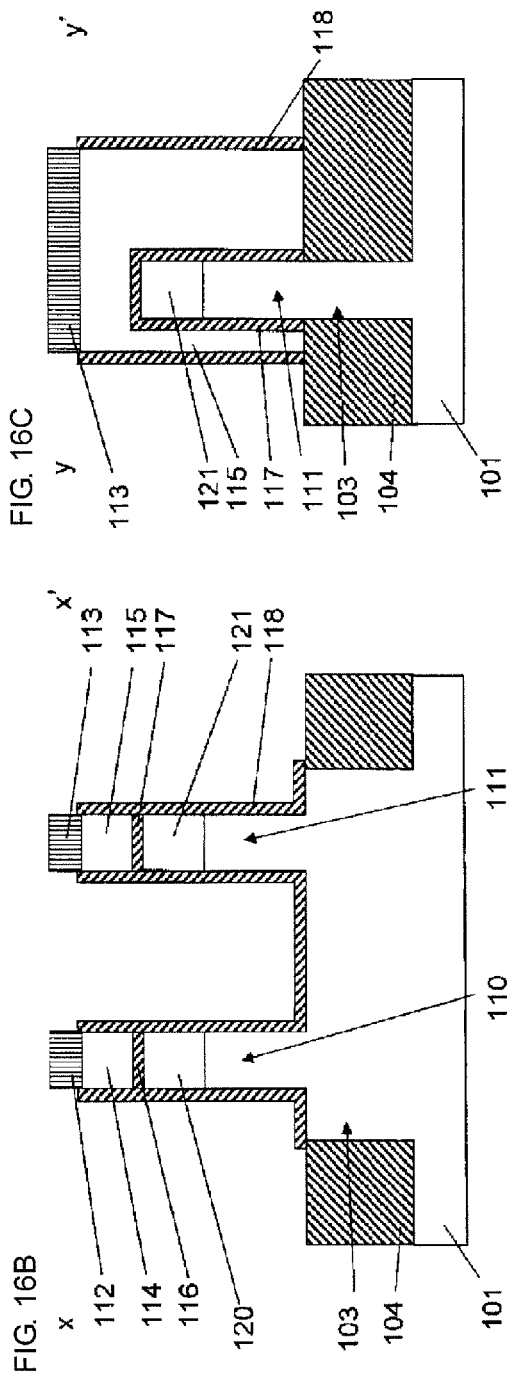
FIG. 16A
FIG. 16B
FIG. 16C

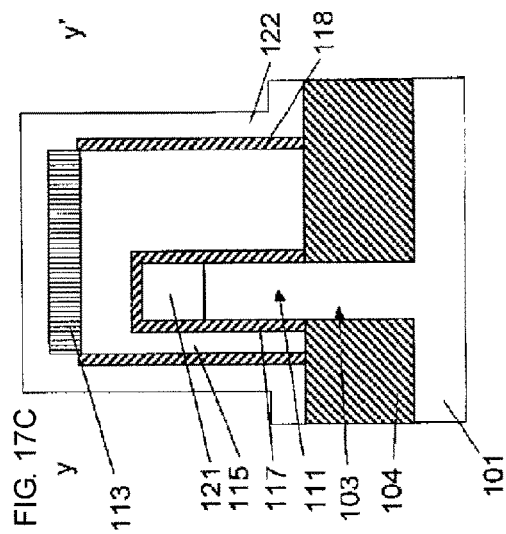
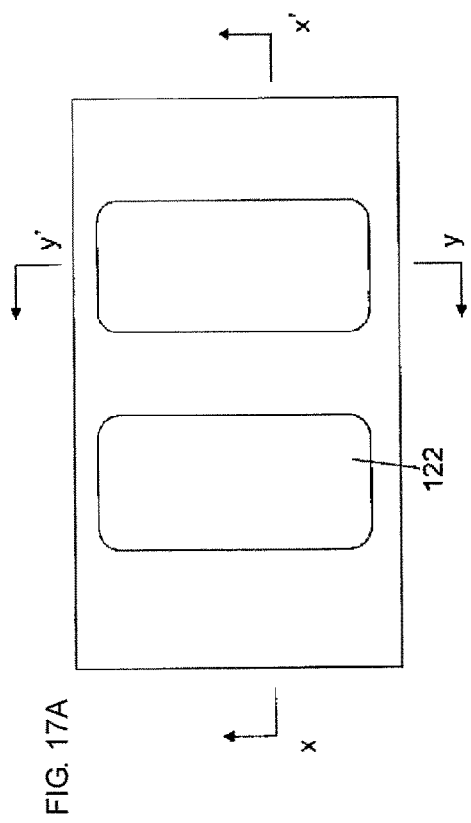
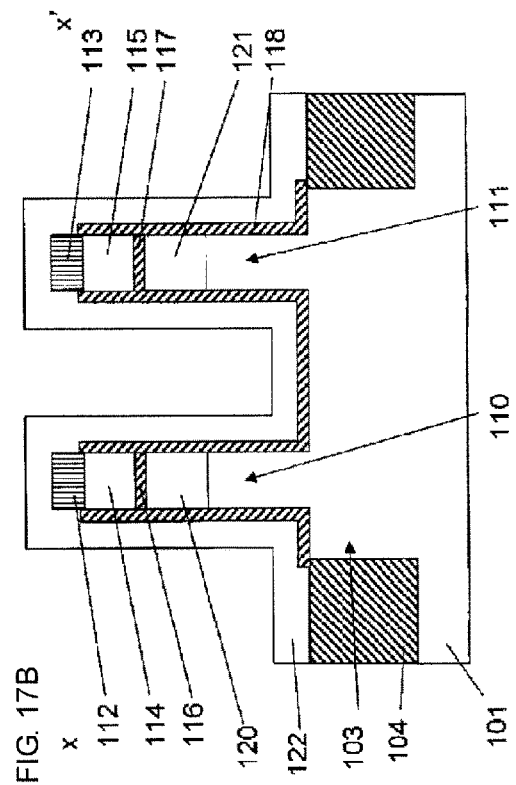

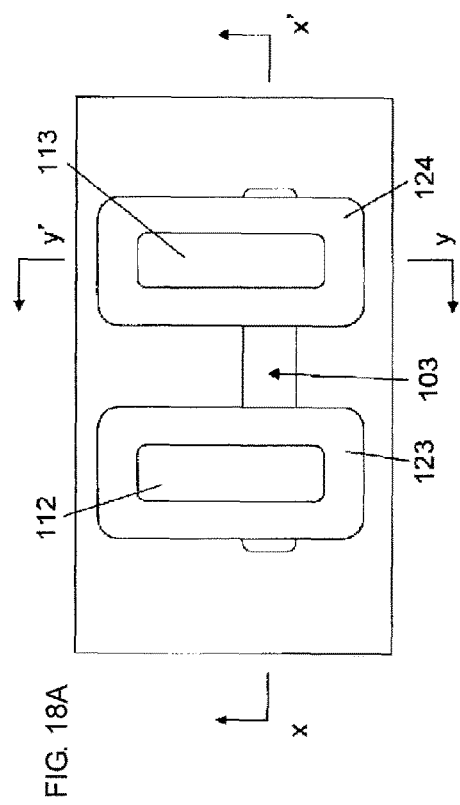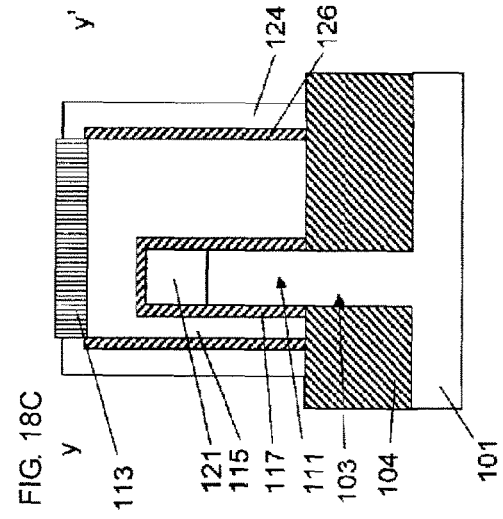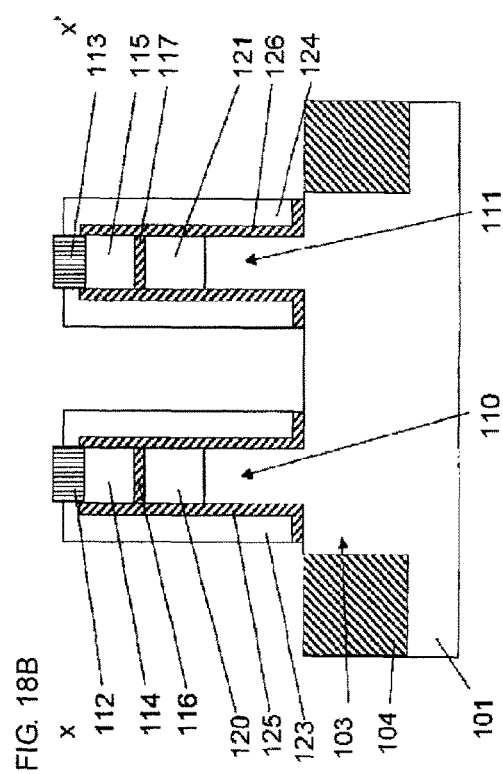

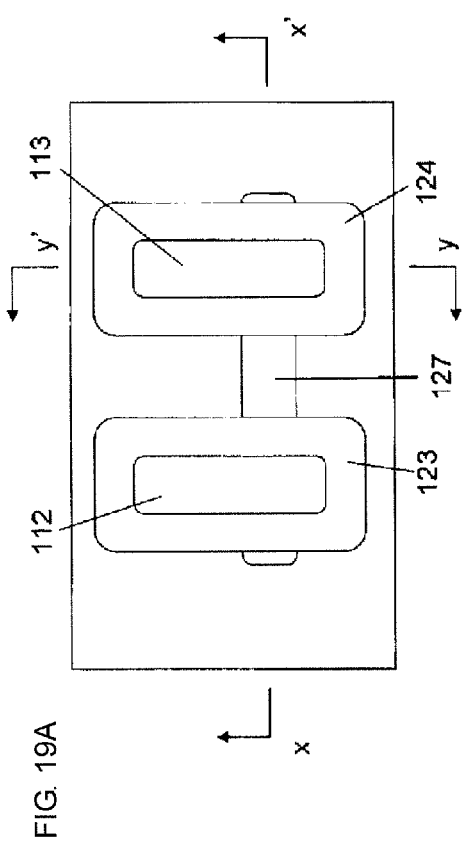
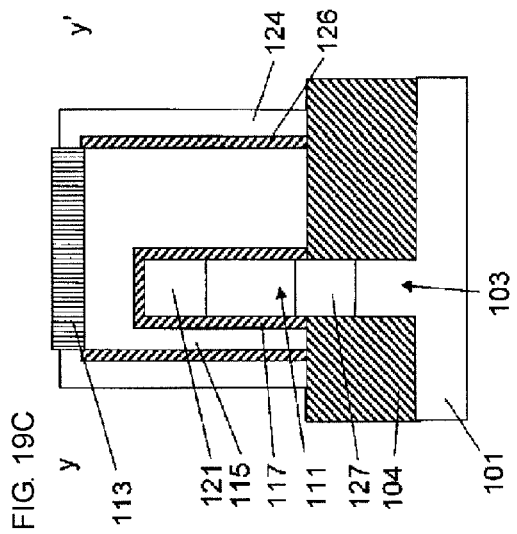
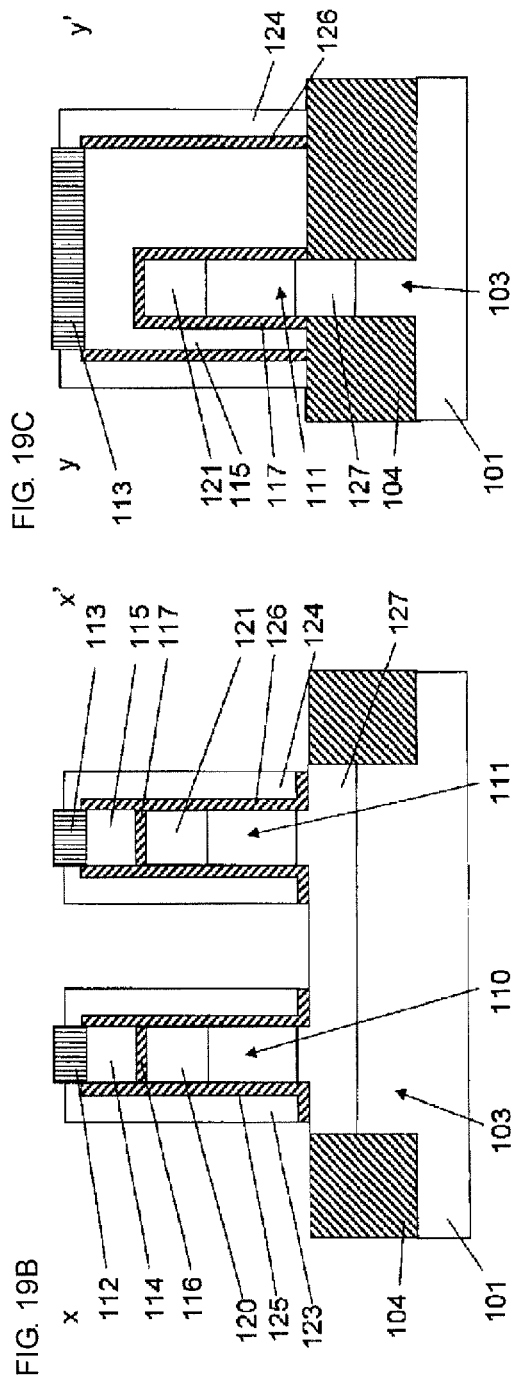
FIG. 19A
FIG. 19B
FIG. 19C

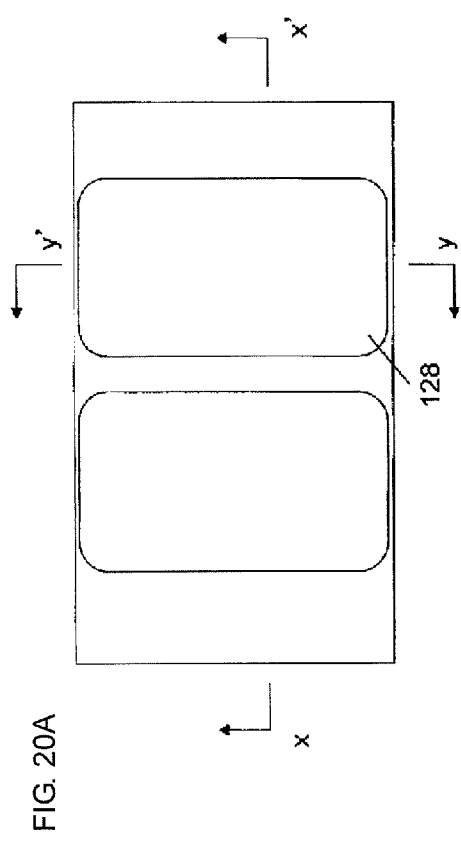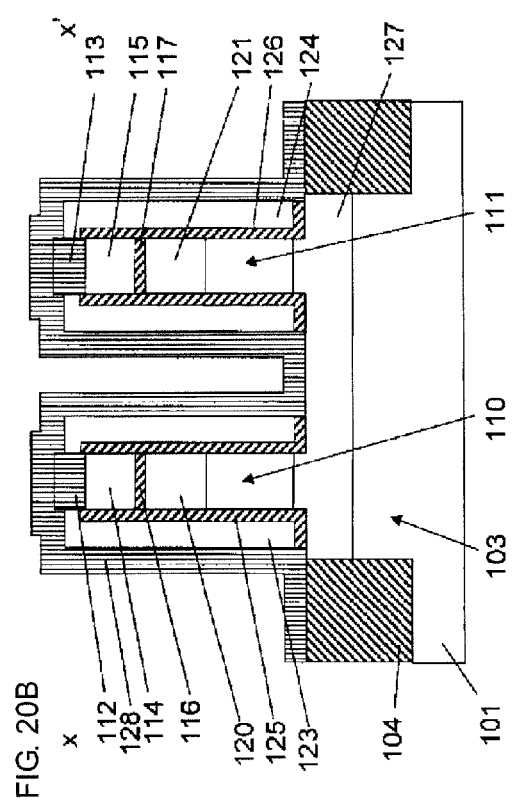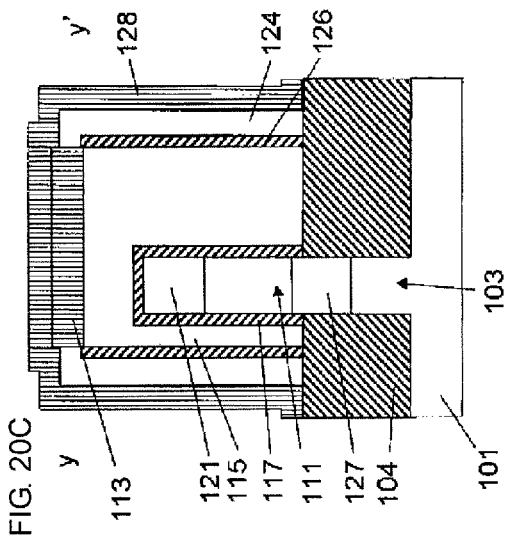

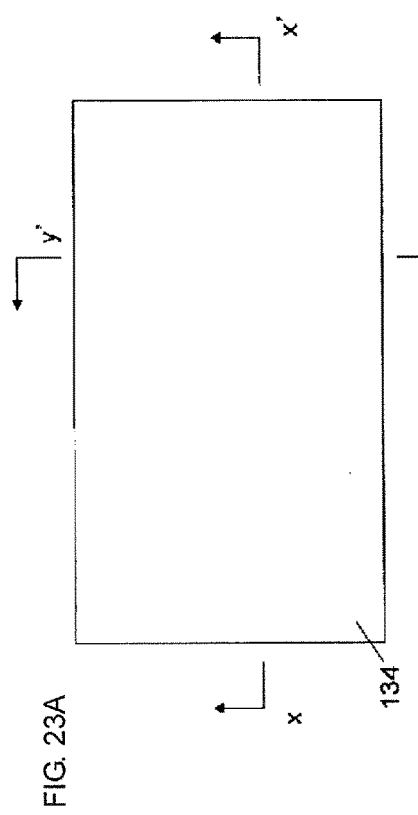
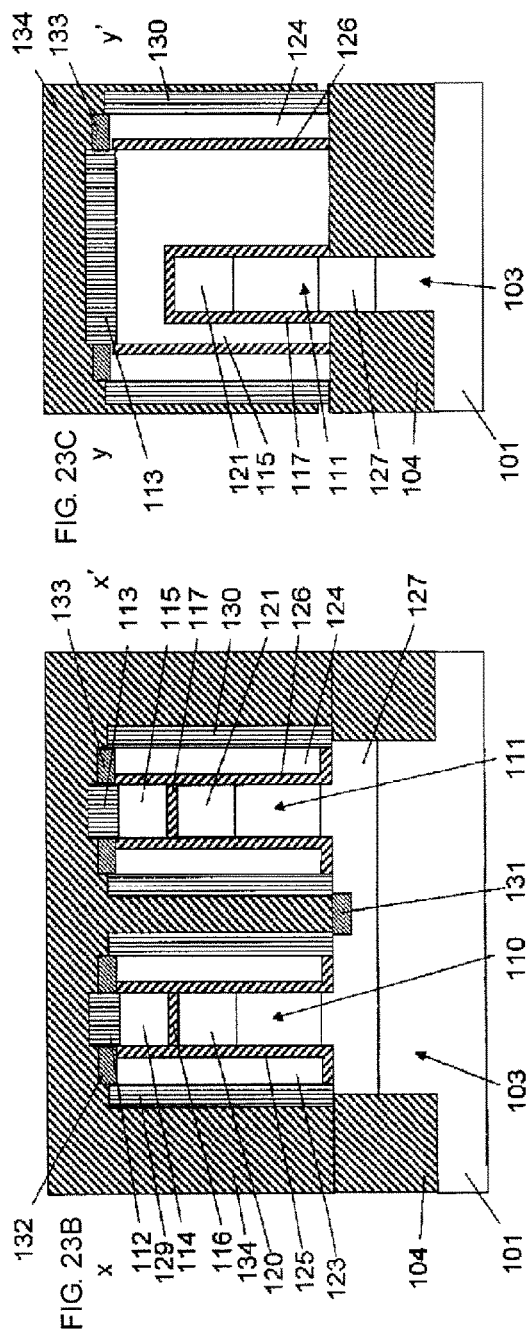
FIG. 23A
FIG. 23B
FIG. 23C

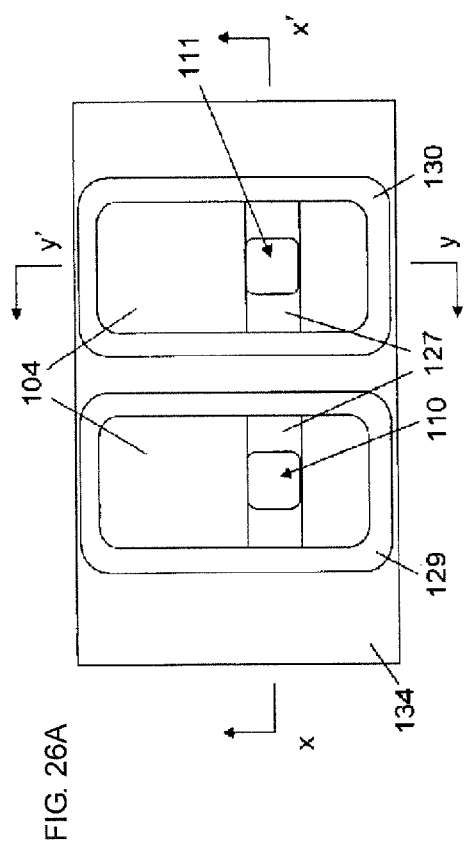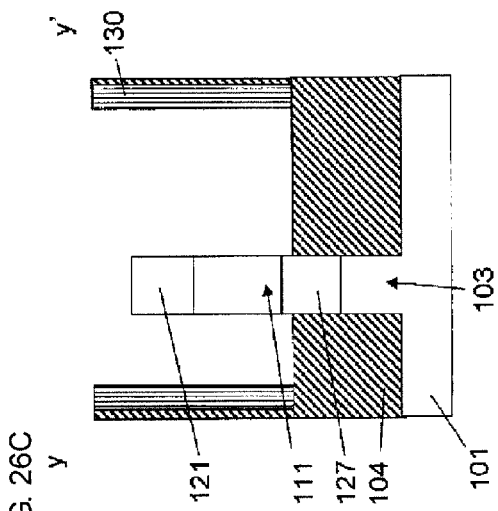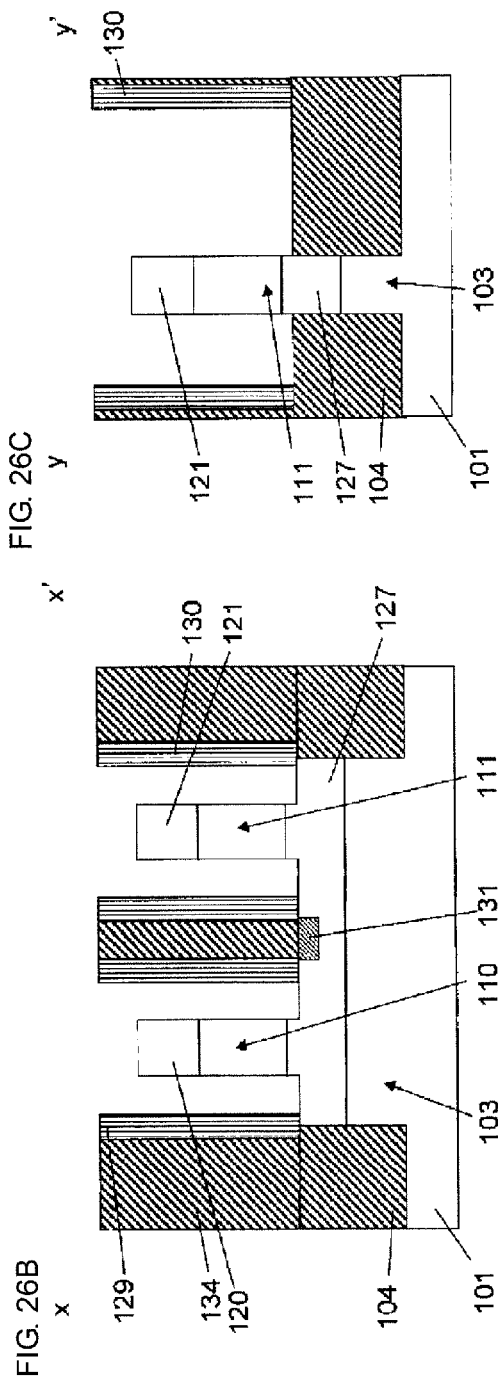

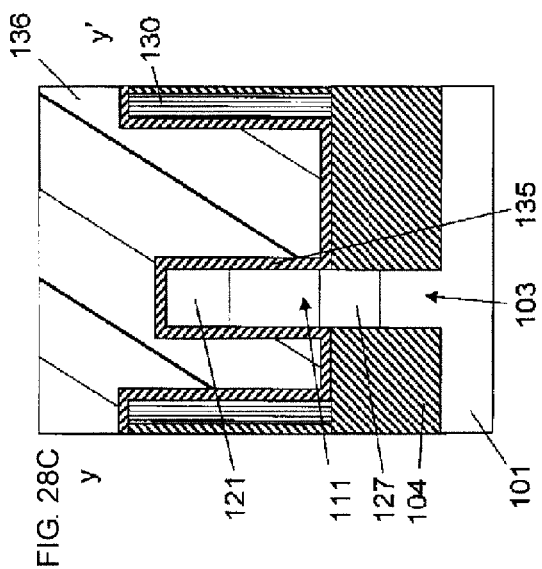
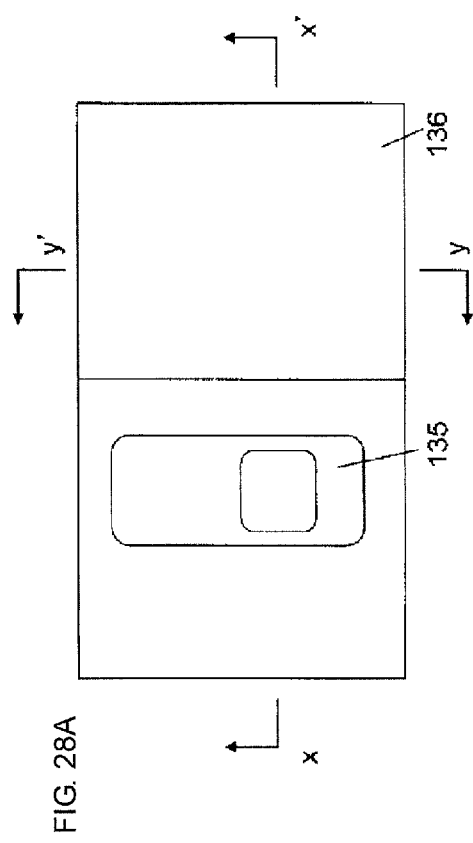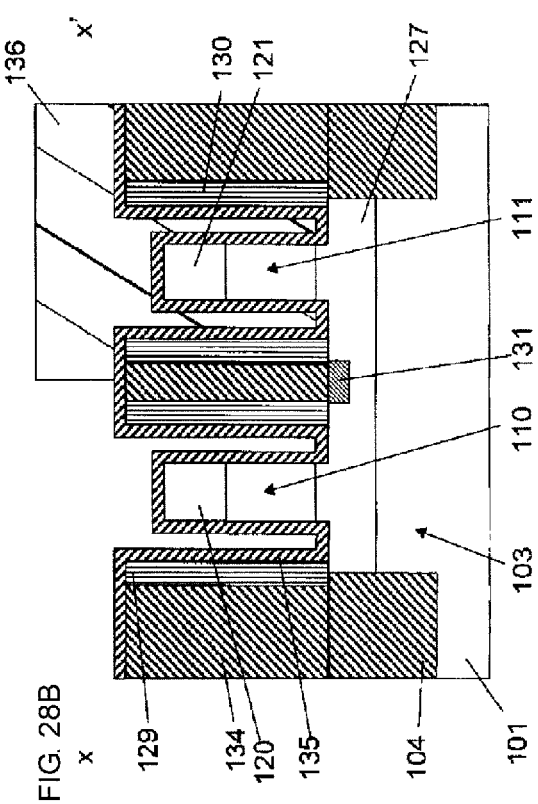

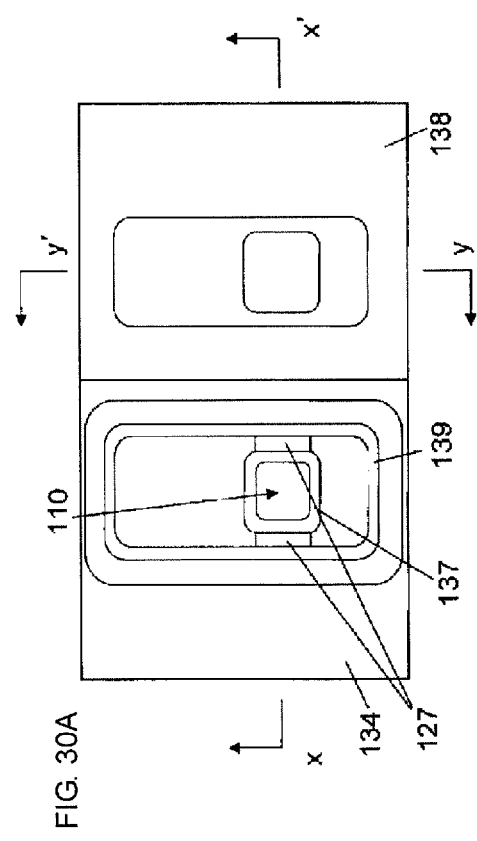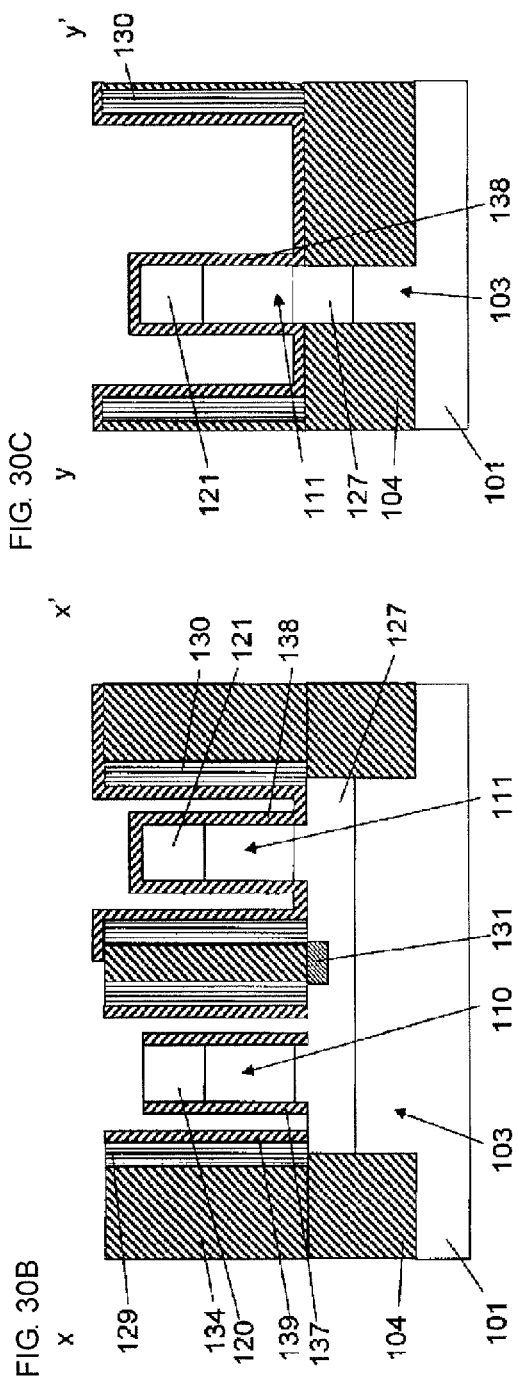
FIG. 30A
FIG. 30B
FIG. 30C

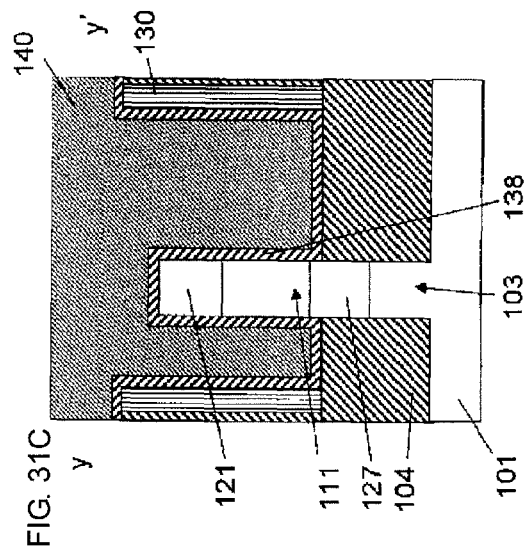
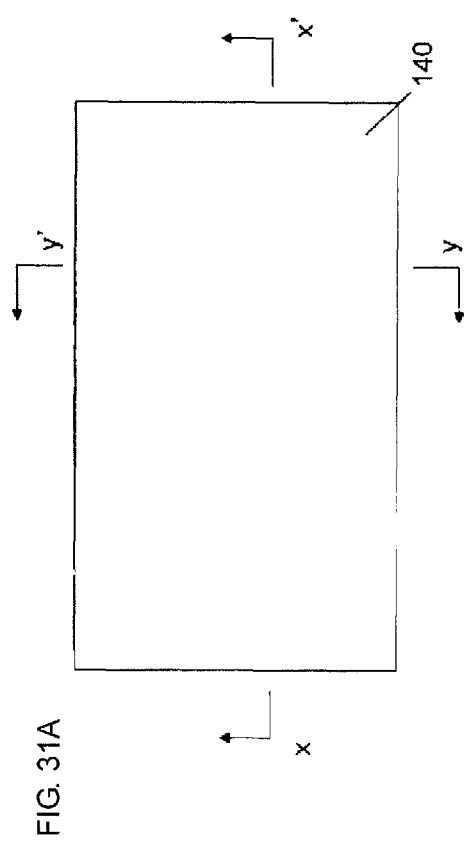
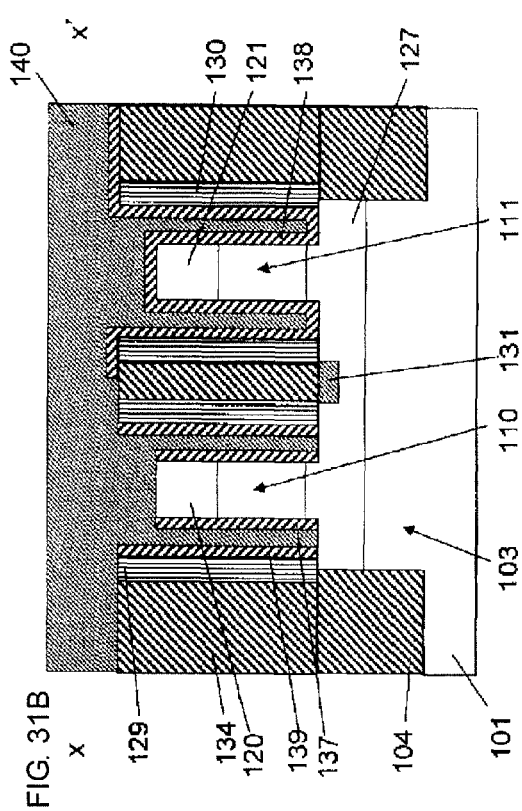
FIG. 31A
FIG. 31B
FIG. 31C

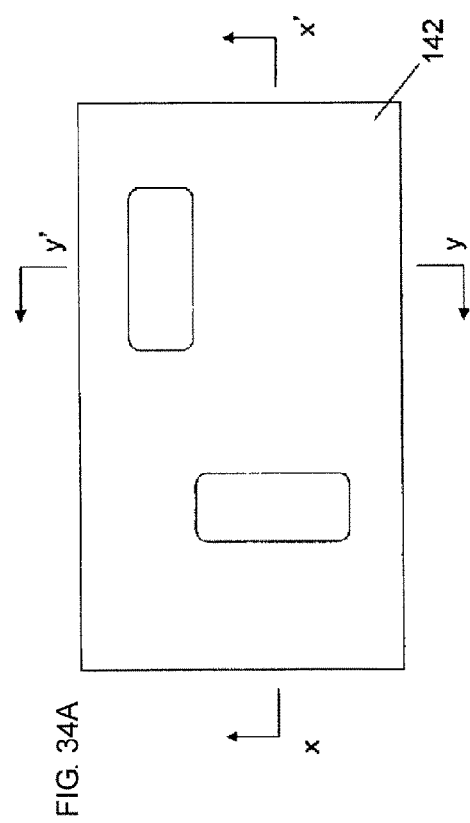
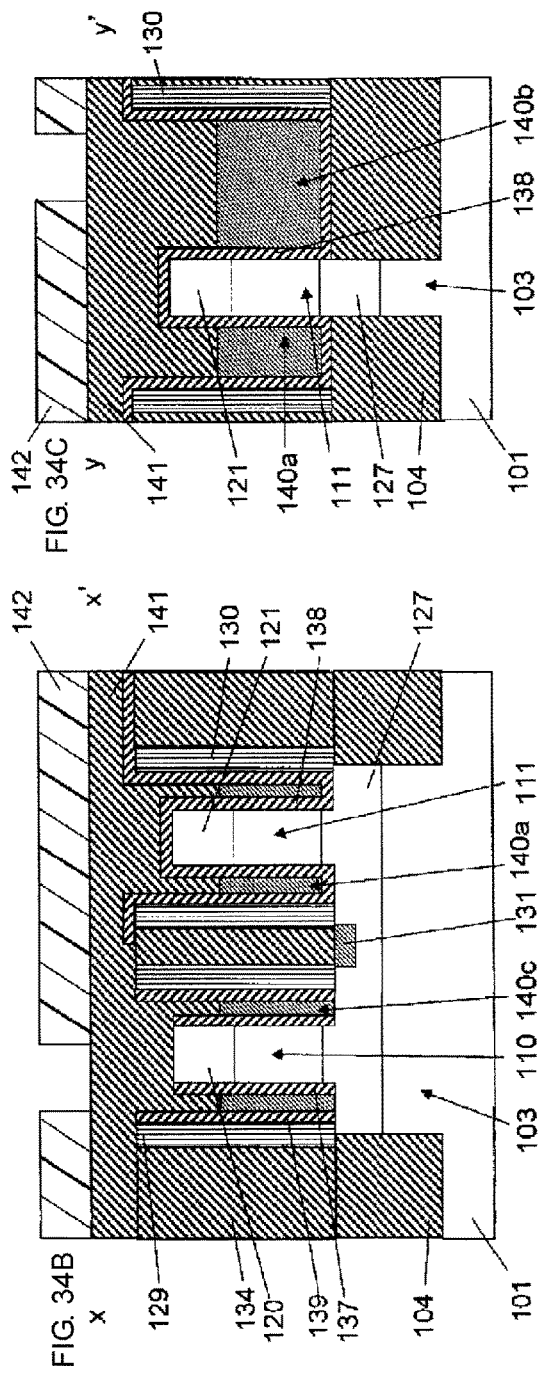
FIG. 34A
FIG. 34B
FIG. 34C

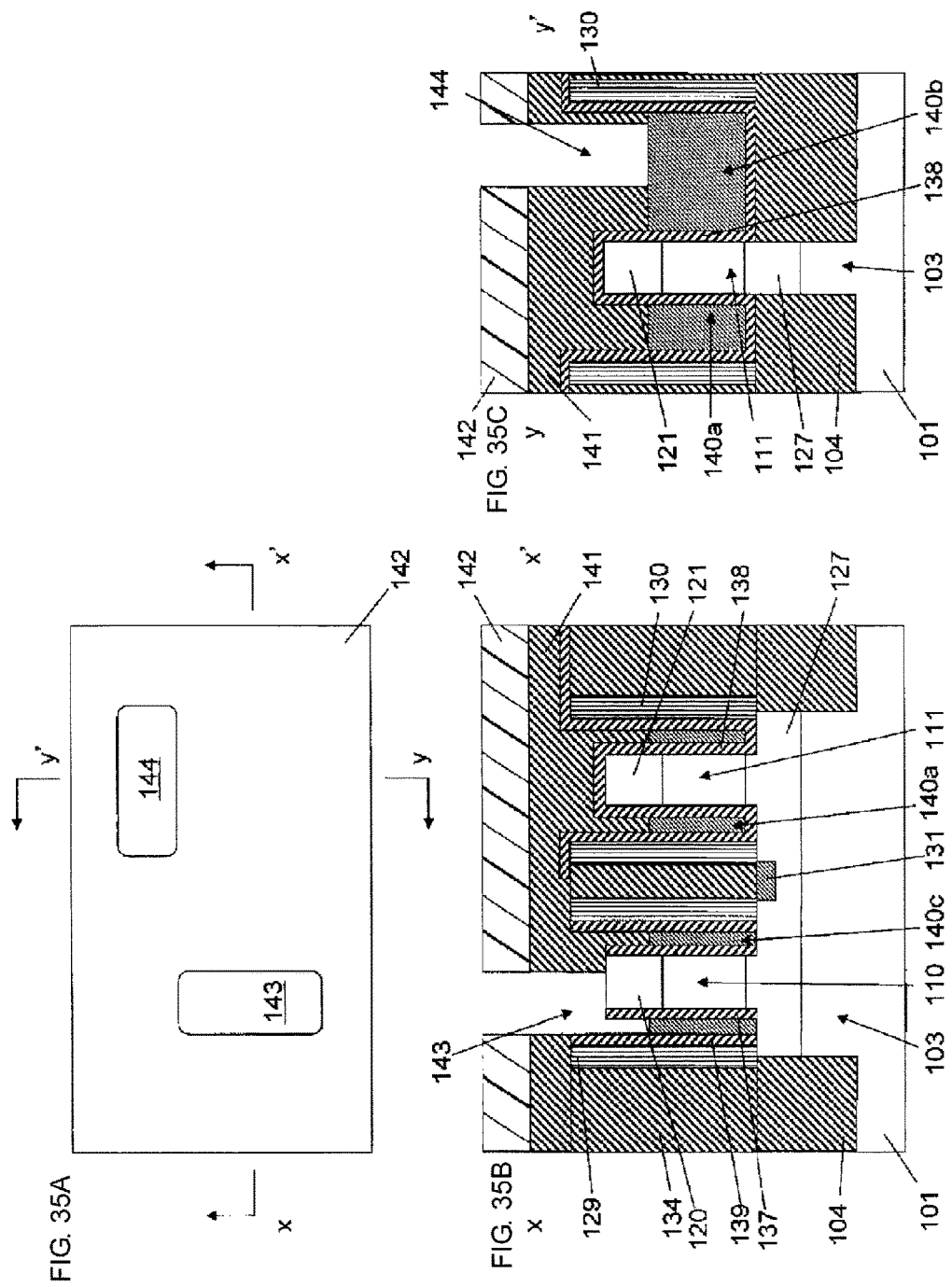

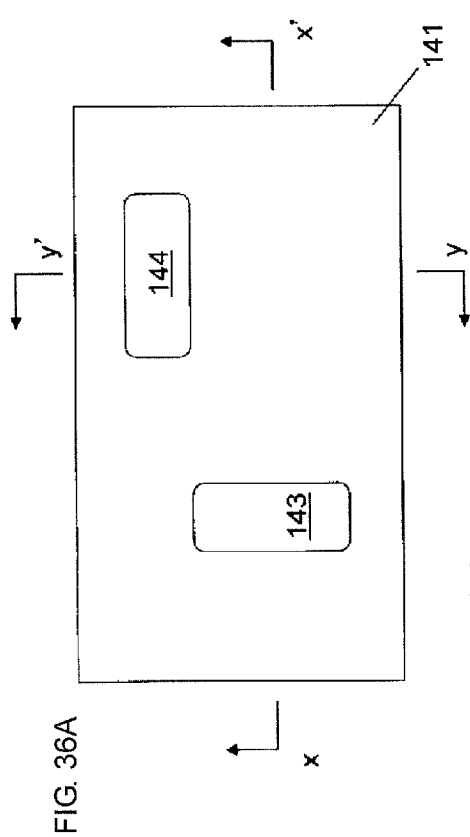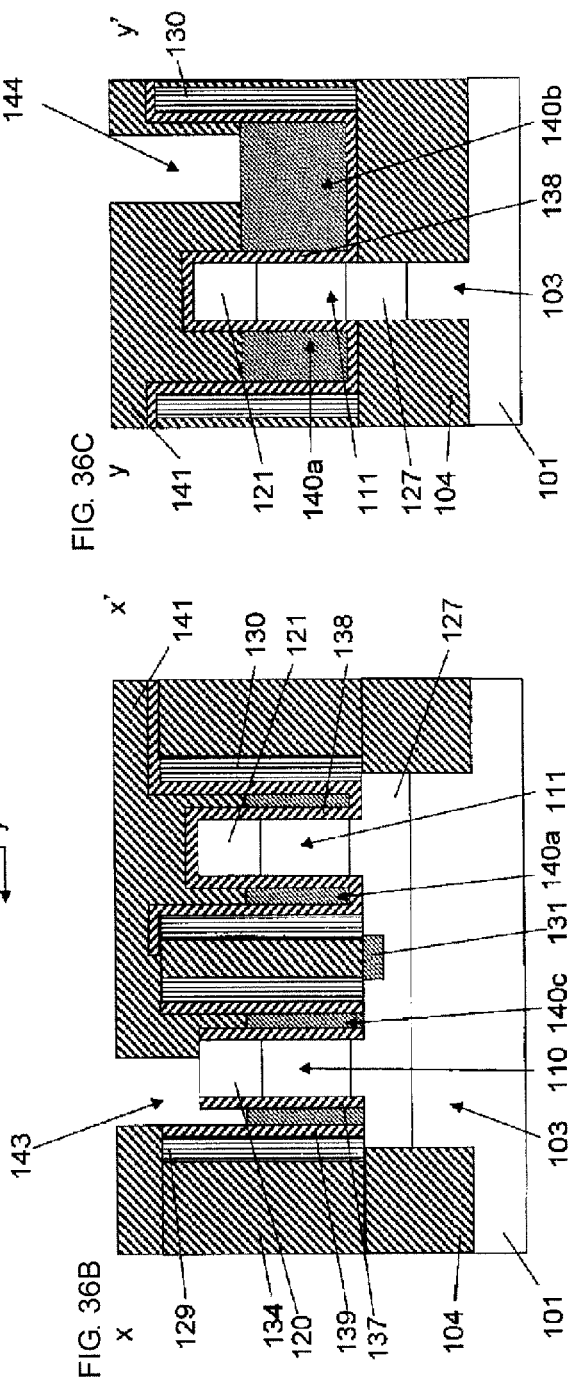
FIG. 36A
FIG. 36B
FIG. 36C

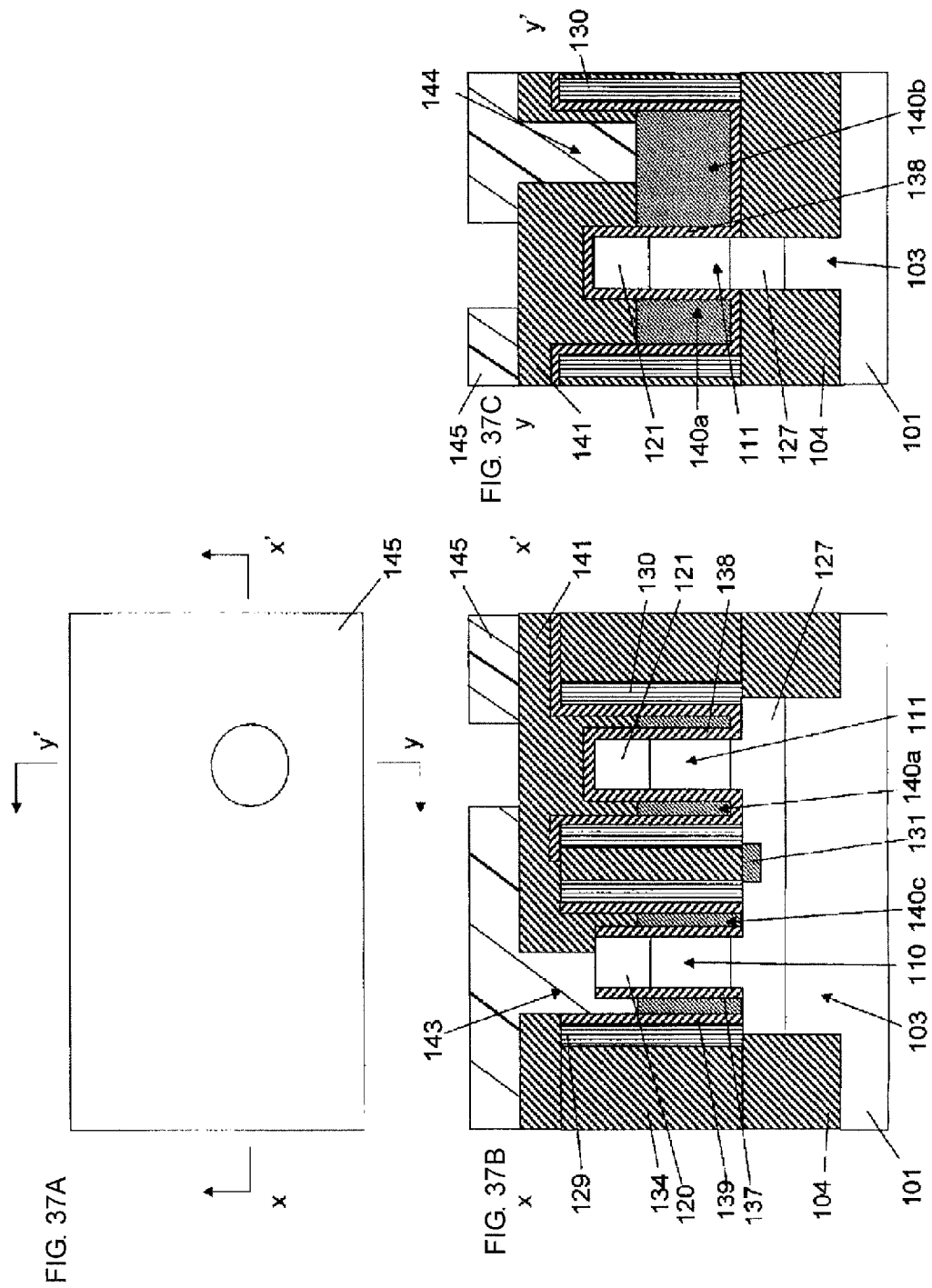

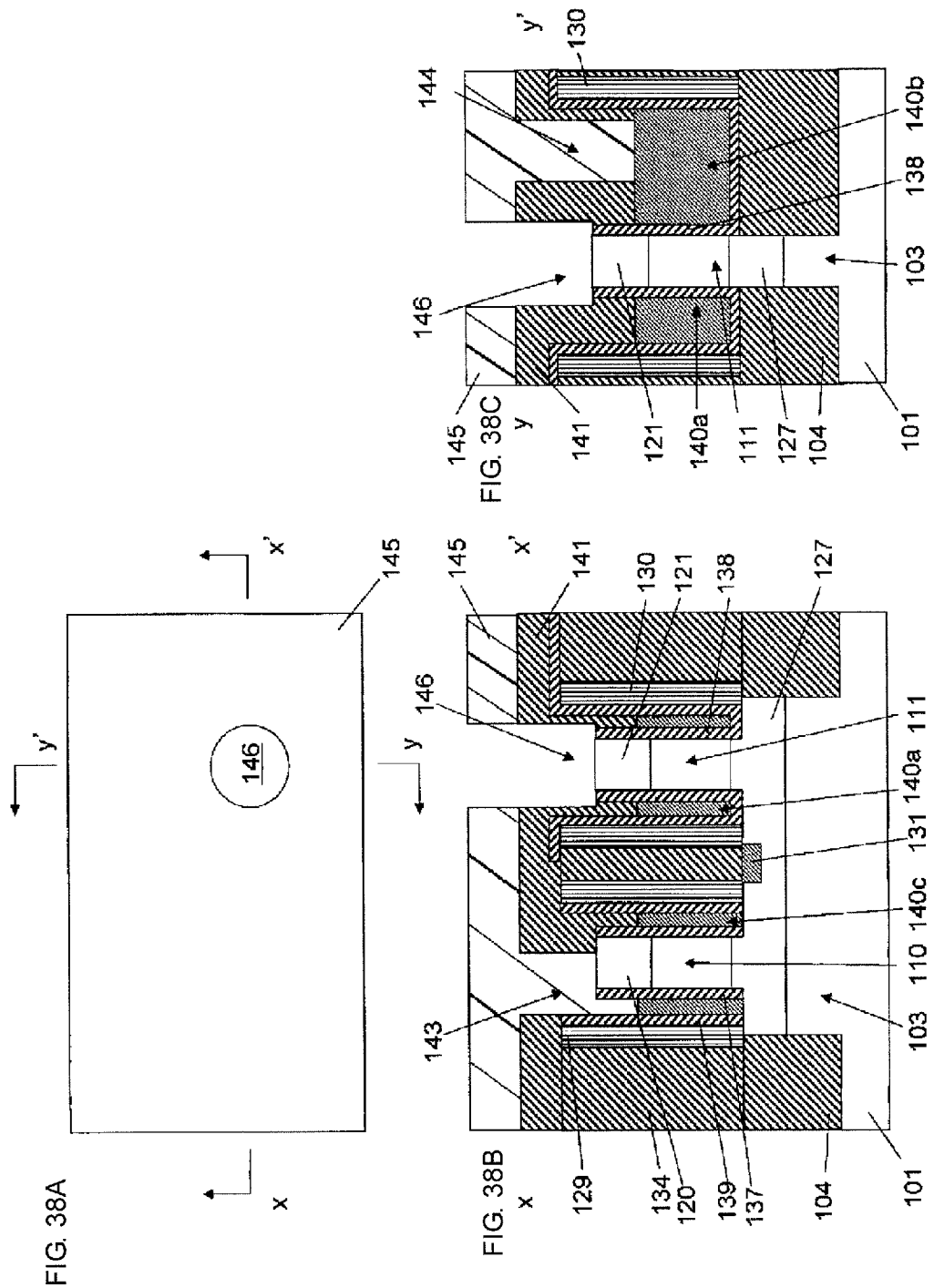

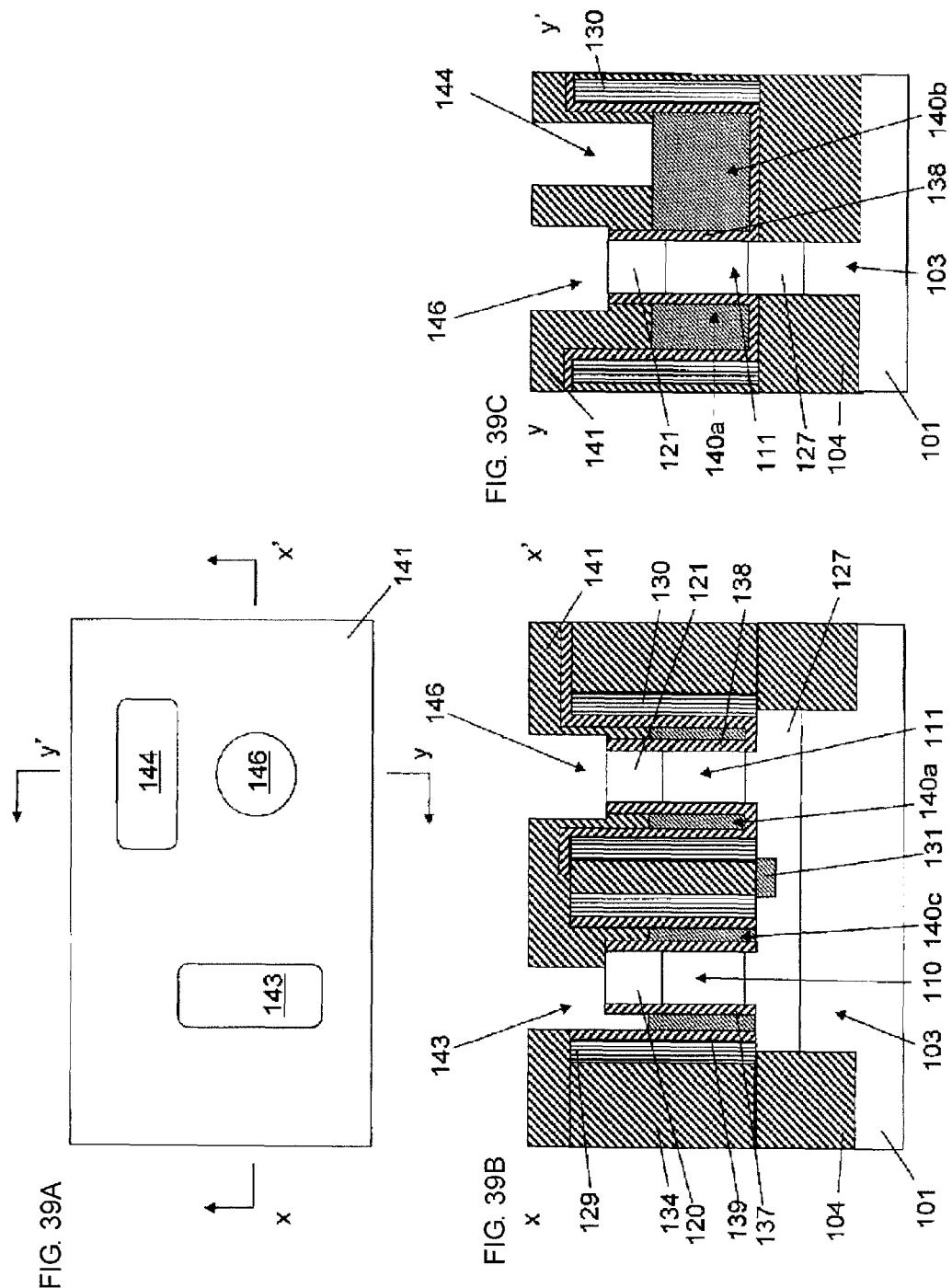

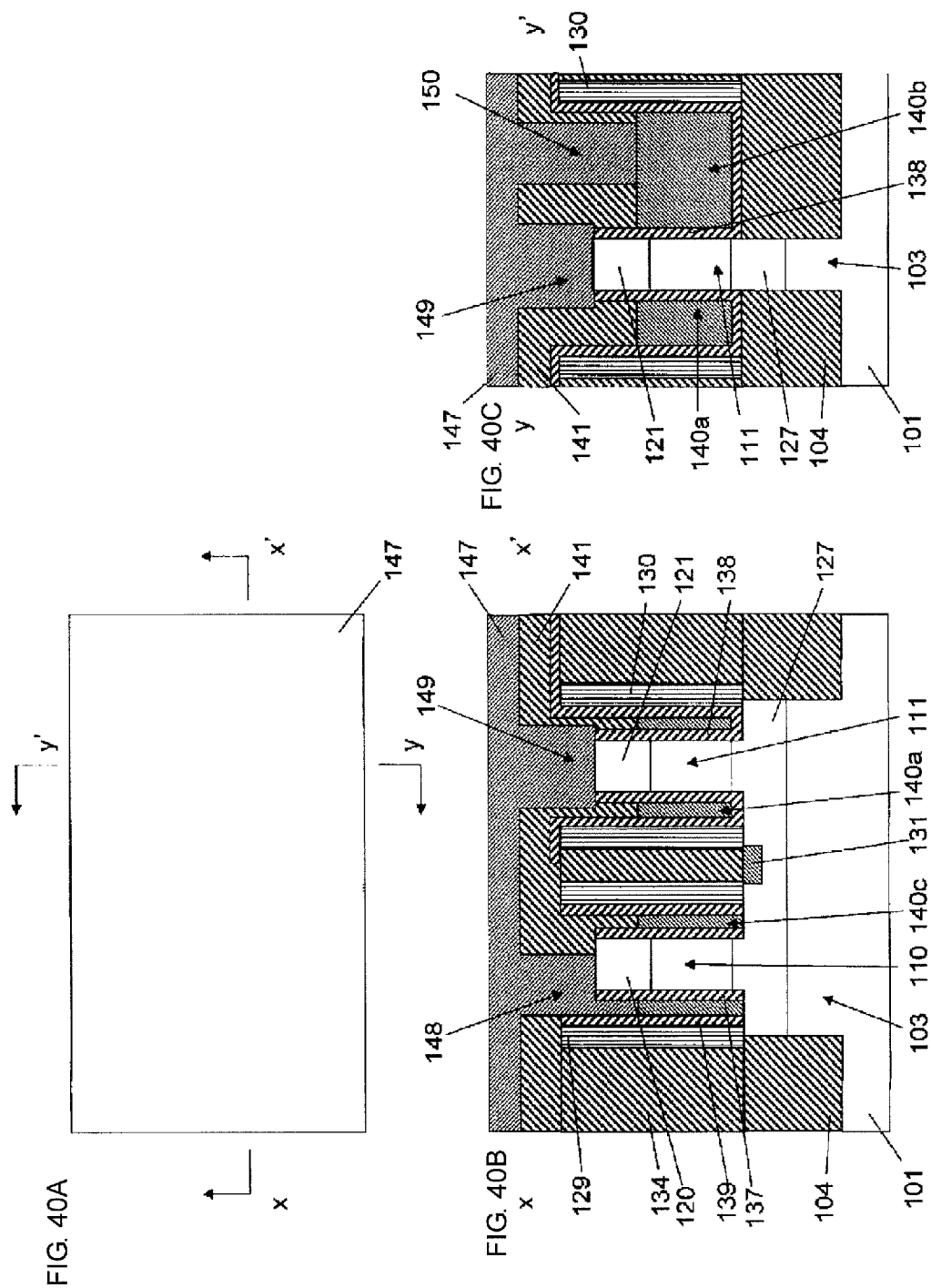

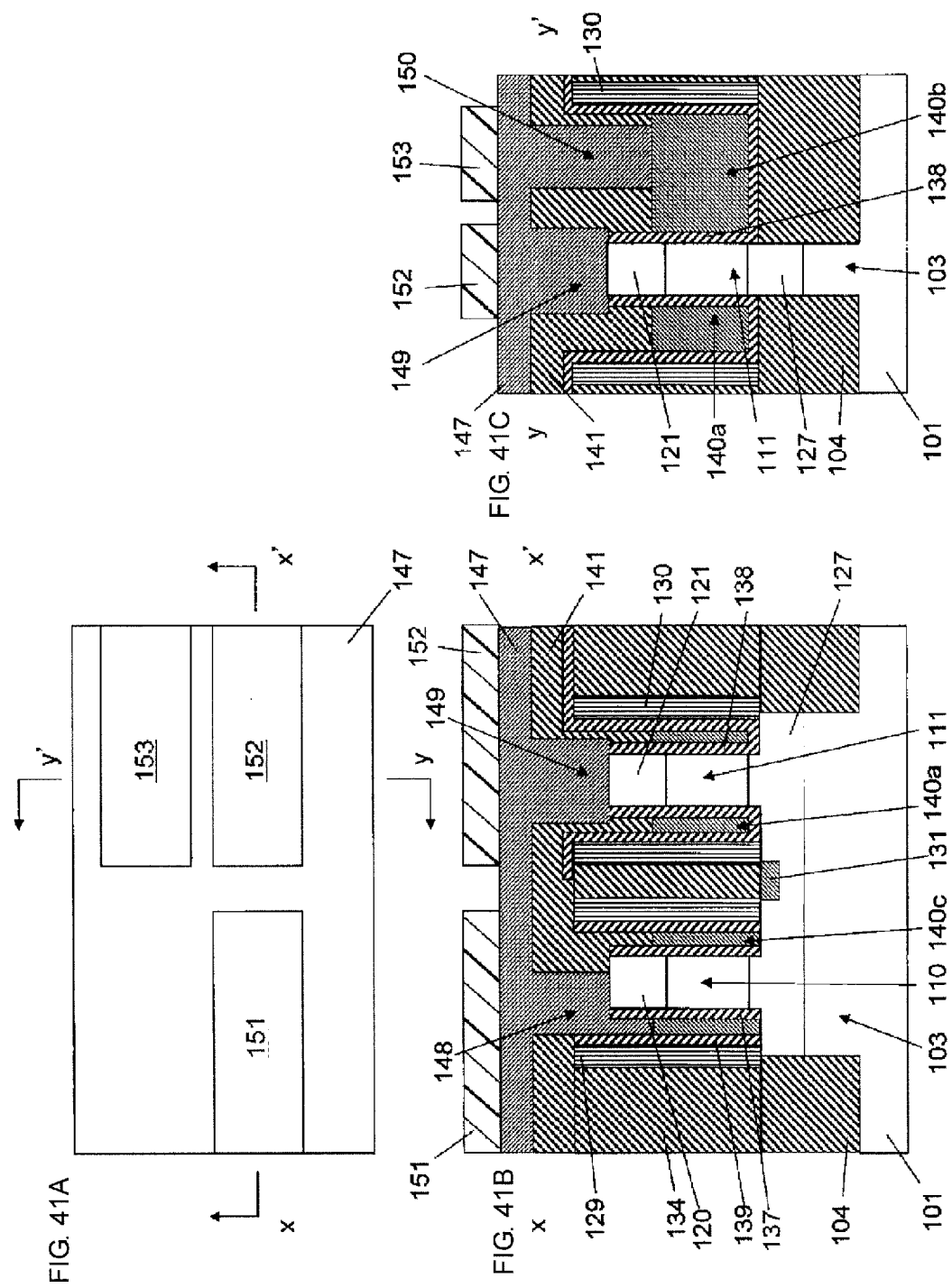

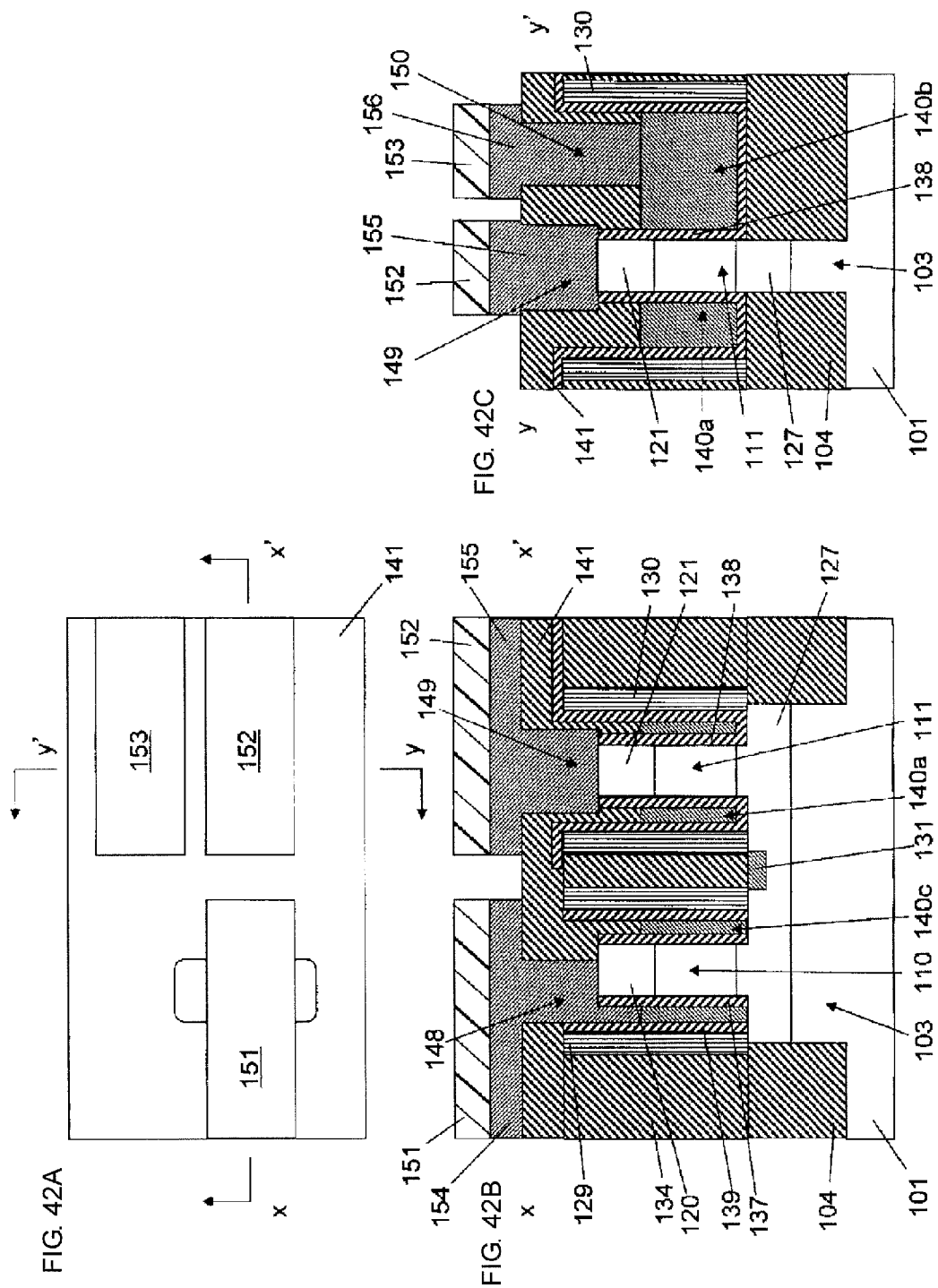

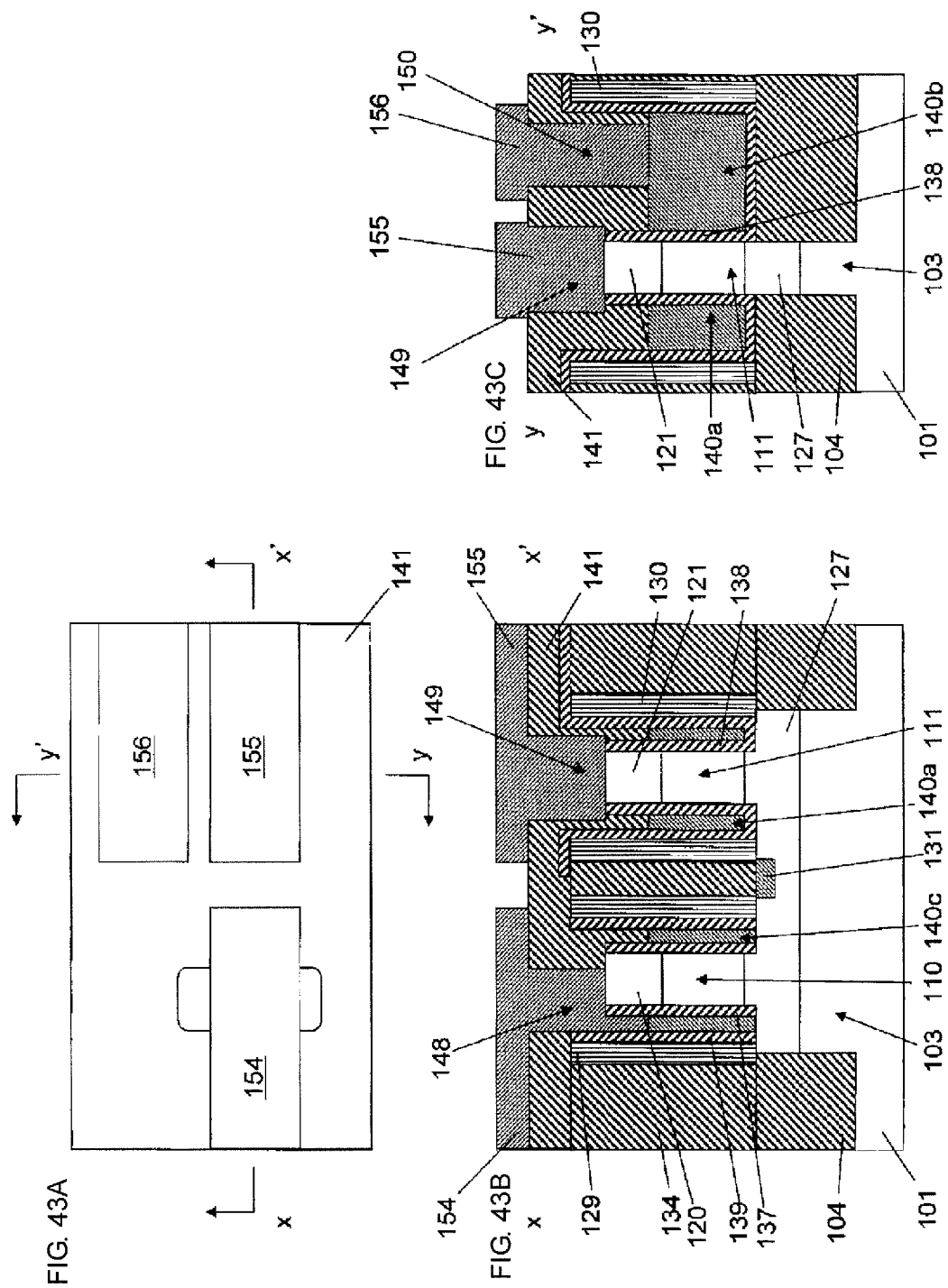

SEMICONDUCTOR DEVICE HAVING FIN-SHAPED SEMICONDUCTOR LAYER

CROSS REFERENCES TO RELATED APPLICATIONS

The present application is a continuation application of PCT/JP2013/066558, filed Jun. 17, 2013, the entire contents of which are incorporated herein by reference.

BACKGROUND OF THE INVENTION

1. Field of the Invention

The present invention relates to a method for producing a semiconductor device and a semiconductor device.

2. Description of the Related Art

The degree of integration of semiconductor integrated circuits, in particular, integrated circuits using MOS transistors, has been continuously increasing. With this trend toward a higher degree of integration, the size of MOS transistors in integrated circuits has been reduced to the order of nanometers. Such reduction in the size of MOS transistors makes it difficult to suppress leakage current. Since a certain amount of current needs to be provided, it is difficult to achieve reduction in the area occupied by circuits, which has been problematic. In order to address such a problem, a Surrounding Gate Transistor (hereafter referred to as "SGT"), which has a structure in which a source, a gate, and a drain are arranged in a direction perpendicular to a substrate and a gate electrode surrounds a pillar-shaped semiconductor layer, has been proposed (for example, refer to Japanese Unexamined Patent Application Publication No. 2-71556, Japanese Unexamined Patent Application Publication No. 2-188966, and Japanese Unexamined Patent Application Publication No. 3-145761).

In an existing SGT production method, a mask for forming silicon pillars is used to form silicon pillars including pillar-shaped nitride hard masks, a mask for forming a planar silicon layer is used to form a planar silicon layer under the silicon pillars, and a mask for forming gate lines is used to form gate lines (for example, refer to Japanese Unexamined Patent Application Publication No. 2009-182317).

In other words, three masks are used to form silicon pillars, a planar silicon layer, and gate lines.

Also, in an existing SGT production method, in order to establish a connection between an upper portion of a planar silicon layer and metal wiring, a deep contact hole is formed (for example, refer to Japanese Unexamined Patent Application Publication No. 2009-182317). With reduction in the size of devices, the aspect ratio (depth/diameter) of contact holes increases. This increase in the aspect ratio causes a decrease in the etching rate. Also, with reduction in the size of a pattern, the thickness of the resist film decreases. Such a thin resist film is itself etched during etching, which makes it difficult to form deep contact holes.

In existing MOS transistors, in order to successfully perform a metal gate process and a high-temperature process, a metal gate-last process of forming a metal gate after a high-temperature process is used for actual products (IEDM2007 K. Mistry et. al, pp 247-250). In production of an SGT, a gate is formed of polysilicon; an interlayer insulating film is subsequently deposited; chemical mechanical polishing is performed to expose the polysilicon gate; the polysilicon gate is etched; and metal is subsequently deposited. Thus, also in the production of an SGT, in order to successfully perform a metal gate process and a high-temperature process, a metal gate-last process of forming a metal gate after a high-temperature process needs to be used.

In existing MOS transistors, in order to decrease a parasitic capacitance between a gate line and a substrate, a first insulating film is used. For example, in a FINFET (IEDM2010 C C. Wu, et. al, 27.1.1-27.1.4), a first insulating film is formed around a single fin-shaped semiconductor layer and the first insulating film is subjected to etch back to expose the fin-shaped semiconductor layer, so that the parasitic capacitance between the gate line and the substrate is decreased. Also for SGTs, in order to decrease the parasitic capacitance between a gate line and a substrate, a first insulating film needs to be used. Since an SGT includes, in addition to a fin-shaped semiconductor layer, a pillar-shaped semiconductor layer, it is necessary to find a way to form the pillar-shaped semiconductor layer.

SUMMARY OF THE INVENTION

Provided are a method for producing an SGT by a gate-last process in which a contact electrode and a contact line connected to an upper portion of the fin-shaped semiconductor layer are formed around a second pillar-shaped semiconductor layer, and a structure produced by this method.

A method for producing a semiconductor device according to an embodiment of the present invention includes a first step of forming a fin-shaped semiconductor layer on a semiconductor substrate and forming a first insulating film around the fin-shaped semiconductor layer, and a second step of, after the first step, forming a second insulating film around the fin-shaped semiconductor layer, depositing a first polysilicon on the second insulating film to achieve planarization, forming, in a direction perpendicular to a direction of the fin-shaped semiconductor layer, a second resist for forming a first gate line and a first pillar-shaped semiconductor layer and a third resist for forming a first contact line and a second pillar-shaped semiconductor layer, and etching the first polysilicon, the second insulating film, and the fin-shaped semiconductor layer to form the first pillar-shaped semiconductor layer, a first dummy gate formed from the first polysilicon, the second pillar-shaped semiconductor layer, and a second dummy gate formed from the first polysilicon.

The method may further include, after depositing the first polysilicon on the second insulating film to achieve planarization, forming a third insulating film on the first polysilicon.

The method may further include a third step of, after the second step, forming a fourth insulating film around the first pillar-shaped semiconductor layer, the second pillar-shaped semiconductor layer, the first dummy gate, and the second dummy gate; depositing a second polysilicon around the fourth insulating film; and etching the second polysilicon so as to remain on side walls of the first dummy gate, the first pillar-shaped semiconductor layer, the second dummy gate, and the second pillar-shaped semiconductor layer to form a third dummy gate and a fourth dummy gate.

In the method, after the fourth insulating film is formed around the first pillar-shaped semiconductor layer, the first dummy gate, the second pillar-shaped semiconductor layer, and the second dummy gate, a fourth resist may be formed and subjected to etch back to expose an upper portion of the first pillar-shaped semiconductor layer, and a first diffusion layer may be formed in the upper portion of the first pillar-shaped semiconductor layer.

The method may further include a fourth step of forming a third diffusion layer in an upper portion of the fin-shaped semiconductor layer, in a lower portion of the first pillar-shaped semiconductor layer, and in a lower portion of the second pillar-shaped semiconductor layer; forming a fifth insulating film around the third dummy gate and the fourth dummy gate; etching the fifth insulating film so as to have a sidewall shape to form sidewalls formed of the fifth insulating film; and forming a metal-semiconductor compound on the third diffusion layer.

The method may further include a fifth step of, after the fourth step, depositing an interlayer insulating film; performing chemical mechanical polishing to expose upper portions of the first dummy gate, the second dummy gate, the third dummy gate, and the fourth dummy gate; removing the first dummy gate, the second dummy gate, the third dummy gate, and the fourth dummy gate; removing the second insulating film and the fourth insulating film; forming a gate insulating film around the first pillar-shaped semiconductor layer, around the second pillar-shaped semiconductor layer, and on inner sides of the fifth insulating film; forming a fifth resist for removing the gate insulating film from around a bottom portion of the second pillar-shaped semiconductor layer; removing the gate insulating film from around the bottom portion of the second pillar-shaped semiconductor layer; depositing metal; and subjecting the metal to etch back to form a gate electrode and a gate line around the first pillar-shaped semiconductor layer and to form a contact electrode and a contact line around the second pillar-shaped semiconductor layer.

A semiconductor device according to an embodiment of the present invention includes a fin-shaped semiconductor layer formed on a semiconductor substrate, a first insulating film formed around the fin-shaped semiconductor layer, a second pillar-shaped semiconductor layer formed on the fin-shaped semiconductor layer, a contact electrode formed of metal and formed around the second pillar-shaped semiconductor layer, a contact line formed of metal and extending in a direction orthogonal to the fin-shaped semiconductor layer connected to the contact electrode, and a third diffusion layer formed in an upper portion of the fin-shaped semiconductor layer and in a lower portion of the second pillar-shaped semiconductor layer, wherein the contact electrode is connected to the third diffusion layer.

The semiconductor device may further include a gate insulating film formed between the second pillar-shaped semiconductor layer and the contact electrode.

In the semiconductor device, a width of the second pillar-shaped semiconductor layer in the direction orthogonal to the fin-shaped semiconductor layer may be equal to a width of the fin-shaped semiconductor layer in the direction orthogonal to the fin-shaped semiconductor layer.

In the semiconductor device, the gate insulating film may be formed around the contact electrode and the contact line.

In the semiconductor device, an outer width of the contact electrode may be equal to a width of the contact line.

The semiconductor device may include the fin-shaped semiconductor layer formed on the semiconductor substrate, the first insulating film formed around the fin-shaped semiconductor layer, a first pillar-shaped semiconductor layer formed on the fin-shaped semiconductor layer, the first pillar-shaped semiconductor layer having a width in the direction orthogonal to the fin-shaped semiconductor layer, the width being equal to a width of the fin-shaped semiconductor layer in the direction orthogonal to the fin-shaped semiconductor layer, a gate insulating film formed around the first pillar-shaped semiconductor layer, a gate electrode formed of metal and formed around the gate insulating film, a gate line formed of metal and extending in the direction orthogonal to the fin-shaped semiconductor layer connected to the gate electrode, the gate insulating film formed around and below the gate electrode and the gate line, the gate electrode having an outer width being equal to a width of the gate line, a first diffusion layer formed in an upper portion of the first pillar-shaped semiconductor layer, and the third diffusion layer formed in an upper portion of the fin-shaped semiconductor layer and in a lower portion of the first pillar-shaped semiconductor layer.

The present invention can provide a method for producing an SGT by a gate-last process in which a gate electrode and a gate line are formed around a first pillar-shaped semiconductor layer and simultaneously a contact electrode and a contact line connected to an upper portion of a fin-shaped semiconductor layer are formed around a second pillar-shaped semiconductor layer; and a structure produced by the method.

According to an embodiment, the following first to third steps are performed. The first step is forming a fin-shaped semiconductor layer on a semiconductor substrate and forming a first insulating film around the fin-shaped semiconductor layer. The second step is, after the first step, forming a second insulating film around the fin-shaped semiconductor layer, depositing a first polysilicon on the second insulating film to achieve planarization, forming, in a direction perpendicular to a direction of the fin-shaped semiconductor layer, a second resist for forming a first gate line and a first pillar-shaped semiconductor layer and a third resist for forming a first contact line and a second pillar-shaped semiconductor layer, and etching the first polysilicon, the second insulating film, and the fin-shaped semiconductor layer to form the first pillar-shaped semiconductor layer, a first dummy gate formed from the first polysilicon, the second pillar-shaped semiconductor layer, and a second dummy gate formed from the first polysilicon. The third step is, after the second step, forming a fourth insulating film around the first pillar-shaped semiconductor layer, the second pillar-shaped semiconductor layer, the first dummy gate, and the second dummy gate; depositing a second polysilicon around the fourth insulating film; and etching the second polysilicon so as to remain on side walls of the first dummy gate, the first pillar-shaped semiconductor layer, the second dummy gate, and the second pillar-shaped semiconductor layer to form a third dummy gate and a fourth dummy gate. This method allows formation of; with achieving reduction in the number of steps, the fin-shaped semiconductor layer, the first pillar-shaped semiconductor layer, the second pillar-shaped semiconductor layer, the first dummy gate and the third dummy gate that are to provide a gate electrode and a gate line, and the second dummy gate and the fourth dummy gate that are to provide a contact electrode and a contact line.

The method may include a step of forming a gate insulating film around the first pillar-shaped semiconductor layer, around the second pillar-shaped semiconductor layer, and on inner sides of the fifth insulating film; subsequently forming a fifth resist for removing the gate insulating film from around a bottom portion of the second pillar-shaped semiconductor layer; and removing the gate insulating film from around the bottom portion of the second pillar-shaped semiconductor layer. In this case, a gate electrode and a gate line can be formed around the first pillar-shaped semiconductor layer and simultaneously a contact electrode and a contact line that are connected to an upper portion of a fin-shaped semiconductor layer can be formed around the second pillar-shaped semiconductor layer. Thus, these connections can be established by etching just for the thickness of the gate insulating film, which eliminates the necessity of performing the step of forming deep contact holes.

The structure including a second pillar-shaped semiconductor layer and a contact electrode and a contact line that are formed around the second pillar-shaped semiconductor layer is the same as a transistor structure except that the contact electrode is connected to the third diffusion layer. Thus, reduction in the number of steps can be achieved.

BRIEF DESCRIPTION OF THE DRAWINGS

FIG. 1A is a plan view of a semiconductor device according to an embodiment of the present invention; FIG. 1B is a sectional view taken along line X-X' in FIG. 1A; and FIG. 1C is a sectional view taken along line Y-Y' in FIG. 1A.

FIG. 2A is a plan view relating to a method for producing a semiconductor device according to an embodiment of the present invention; FIG. 2B is a sectional view taken along line X-X' in FIG. 2A; and FIG. 2C is a sectional view taken along line Y-Y' in FIG. 2A.

FIG. 3A is a plan view relating to a method for producing a semiconductor device according to an embodiment of the present invention; FIG. 3B is a sectional view taken along line X-X' in FIG. 3A; and FIG. 3C is a sectional view taken along line Y-Y' in FIG. 3A.

FIG. 6A is a plan view relating to a method for producing a semiconductor device according to an embodiment of the present invention; FIG. 6B is a sectional view taken along line X-X' in FIG. 6A; and FIG. 6C is a sectional view taken along line Y-Y' in FIG. 6A.

FIG. 9A is a plan view relating to a method for producing a semiconductor device according to an embodiment of the present invention; FIG. 9B is a sectional view taken along line X-X' in FIG. 9A; and FIG. 9C is a sectional view taken along line Y-Y' in FIG. 9A.

FIG. 10A is a plan view relating to a method for producing a semiconductor device according to an embodiment of the present invention; FIG. 10B is a sectional view taken along line X-X' in FIG. 10A; and FIG. 10C is a sectional view taken along line Y-Y' in FIG. 10A.

FIG. 11A is a plan view relating to a method for producing a semiconductor device according to an embodiment of the present invention; FIG. 11B is a sectional view taken along line X-X' in FIG. 11A; and FIG. 11C is a sectional view taken along line Y-Y' in FIG. 11A.

FIG. 12A is a plan view relating to a method for producing a semiconductor device according to an embodiment of the present invention; FIG. 12B is a sectional view taken along line X-X' in FIG. 12A; and FIG. 12C is a sectional view taken along line Y-Y' in FIG. 12A.

FIG. 15A is a plan view relating to a method for producing a semiconductor device according to an embodiment of the present invention; FIG. 15B is a sectional view taken along line X-X' in FIG. 15A; and FIG. 15C is a sectional view taken along line Y-Y' in FIG. 15A.

FIG. 16A is a plan view relating to a method for producing a semiconductor device according to an embodiment of the present invention; FIG. 16B is a sectional view taken along line X-X' in FIG. 16A; and FIG. 16C is a sectional view taken along line Y-Y' in FIG. 16A.

FIG. 17A is a plan view relating to a method for producing a semiconductor device according to an embodiment of the present invention; FIG. 17B is a sectional view taken along line X-X' in FIG. 17A; and FIG. 17C is a sectional view taken along line Y-Y' in FIG. 17A.

FIG. 18A is a plan view relating to a method for producing a semiconductor device according to an embodiment of the present invention; FIG. 18B is a sectional view taken along line X-X' in FIG. 18A; and FIG. 18C is a sectional view taken along line Y-Y' in FIG. 18A.

FIG. 19A is a plan view relating to a method for producing a semiconductor device according to an embodiment of the present invention; FIG. 19B is a sectional view taken along line X-X' in FIG. 19A; and FIG. 19C is a sectional view taken along line Y-Y' in FIG. 19A.

FIG. 20A is a plan view relating to a method for producing a semiconductor device according to an embodiment of the present invention; FIG. 20B is a sectional view taken along line X-X' in FIG. 20A; and FIG. 20C is a sectional view taken along line Y-Y' in FIG. 20A.

FIG. 23A is a plan view relating to a method for producing a semiconductor device according to an embodiment of the present invention; FIG. 23B is a sectional view taken along line X-X' in FIG. 23A; and FIG. 23C is a sectional view taken along line Y-Y' in FIG. 23A.

FIG. 26A is a plan view relating to a method for producing a semiconductor device according to an embodiment of the present invention; FIG. 26B is a sectional view taken along line X-X' in FIG. 26A; and FIG. 26C is a sectional view taken along line Y-Y' in FIG. 26A.

FIG. 28A is a plan view relating to a method for producing a semiconductor device according to an embodiment of the present invention; FIG. 28B is a sectional view taken along line X-X' in FIG. 28A; and FIG. 28C is a sectional view taken along line Y-Y' in FIG. 28A.

FIG. 30A is a plan view relating to a method for producing a semiconductor device according to an embodiment of the present invention; FIG. 30B is a sectional view taken along line X-X' in FIG. 30A; and FIG. 30C is a sectional view taken along line Y-Y' in FIG. 30A.

FIG. 31A is a plan view relating to a method for producing a semiconductor device according to an embodiment of the present invention; FIG. 31B is a sectional view taken along line X-X' in FIG. 31A; and FIG. 31C is a sectional view taken along line Y-Y' in FIG. 31A.

FIG. 34A is a plan view relating to a method for producing a semiconductor device according to an embodiment of the present invention; FIG. 34B is a sectional view taken along line X-X' in FIG. 34A; and FIG. 34C is a sectional view taken along line Y-Y' in FIG. 34A.

FIG. 35A is a plan view relating to a method for producing a semiconductor device according to an embodiment of the present invention; FIG. 35B is a sectional view taken along line X-X' in FIG. 35A; and FIG. 35C is a sectional view taken along line Y-Y' in FIG. 35A.

FIG. 36A is a plan view relating to a method for producing a semiconductor device according to an embodiment of the present invention; FIG. 36B is a sectional view taken along line X-X' in FIG. 36A; and FIG. 36C is a sectional view taken along line Y-Y' in FIG. 36A.

FIG. 37A is a plan view relating to a method for producing a semiconductor device according to an embodiment of the present invention; FIG. 37B is a sectional view taken along line X-X' in FIG. 37A; and FIG. 37C is a sectional view taken along line Y-Y' in FIG. 37A.

FIG. 38A is a plan view relating to a method for producing a semiconductor device according to an embodiment of the present invention; FIG. 38B is a sectional view taken along line X-X' in FIG. 38A; and FIG. 38C is a sectional view taken along line Y-Y' in FIG. 38A.

FIG. 39A is a plan view relating to a method for producing a semiconductor device according to an embodiment of the present invention; FIG. 39B is a sectional view taken along line X-X' in FIG. 39A; and FIG. 39C is a sectional view taken along line Y-Y' in FIG. 39A.

FIG. 40A is a plan view relating to a method for producing a semiconductor device according to an embodiment of the present invention; FIG. 40B is a sectional view taken along line X-X' in FIG. 40A; and FIG. 40C is a sectional view taken along line Y-Y' in FIG. 40A.

FIG. 41A is a plan view relating to a method for producing a semiconductor device according to an embodiment of the present invention; FIG. 41B is a sectional view taken along line X-X' in FIG. 41A; and FIG. 41C is a sectional view taken along line Y-Y' in FIG. 41A.

FIG. 42A is a plan view relating to a method for producing a semiconductor device according to an embodiment of the present invention; FIG. 42B is a sectional view taken along line X-X' in FIG. 42A; and FIG. 42C is a sectional view taken along line Y-Y' in FIG. 42A.

FIG. 43A is a plan view relating to a method for producing a semiconductor device according to an embodiment of the present invention; FIG. 43B is a sectional view taken along line X-X' in FIG. 43A; and FIG. 43C is a sectional view taken along line Y-Y' in FIG. 43A.

DETAILED DESCRIPTION OF THE PREFERRED EMBODIMENTS

Hereinafter, production steps for forming an SGT structure according to an embodiment of the present invention will be described with reference to FIGS. 2A to 43C.

First, the following is a description of a first step of forming a fin-shaped semiconductor layer on a semiconductor substrate and forming a first insulating film around the fin-shaped semiconductor layer. In this embodiment, a silicon substrate is employed; alternatively, a substrate formed of another semiconductor may be used.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. In this embodiment, the resist is used as a mask for forming the fin-shaped silicon layer; alternatively, a hard mask such as an oxide film or a nitride film may be used.

Figure 4A:
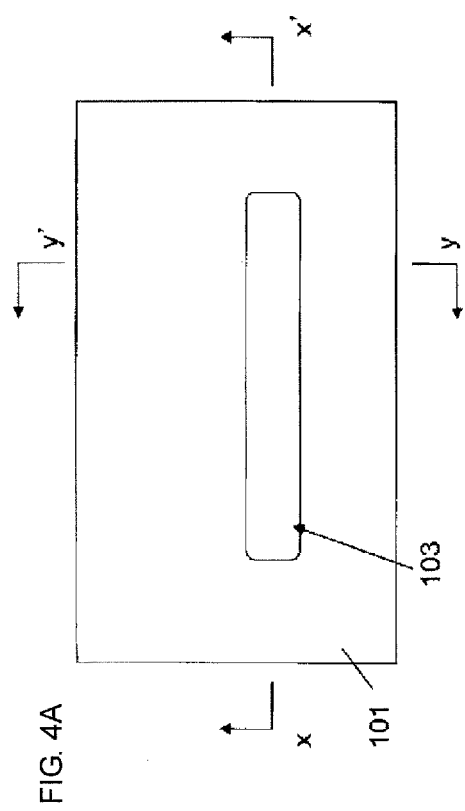
FIG. 4A is a plan view relating to a method for producing a semiconductor device according to an embodiment of the present invention.
Figure 4C:
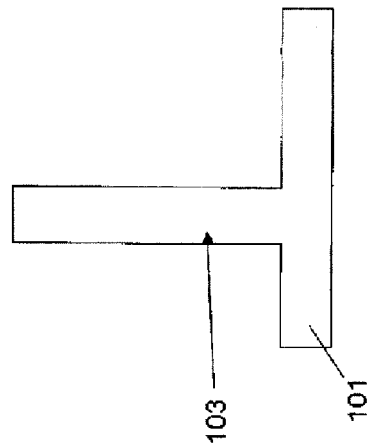
FIG. 4C is a sectional view taken along line Y-Y' in FIG. 4A.
Figure 4B:
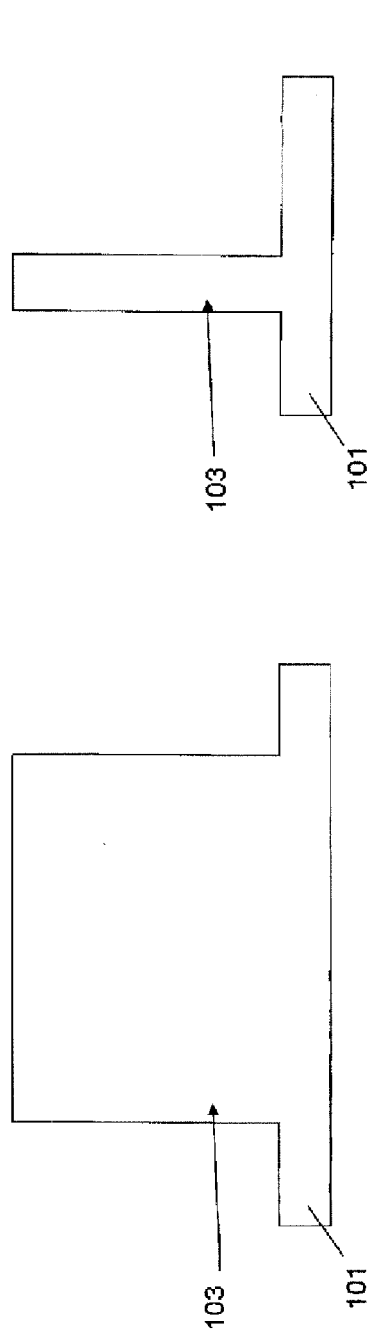
FIG. 4B is a sectional view taken along line X-X' in FIG. 4A.

As illustrated in FIGS. 4A to 4C, the first resist 102 is removed.

Figure 5A:
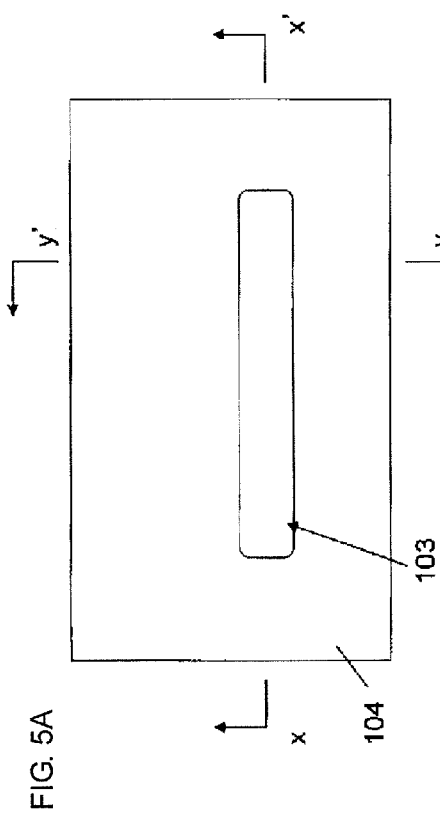
FIG. 5A is a plan view relating to a method for producing a semiconductor device according to an embodiment of the present invention.
Figure 5C:
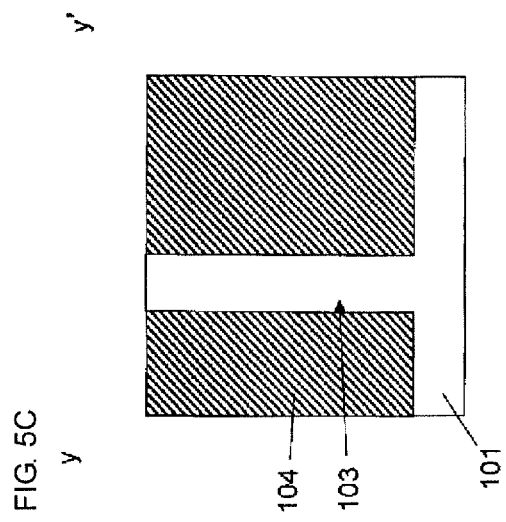
FIG. 5C is a sectional view taken along line Y-Y' in FIG. 5A.
Figure 5B:
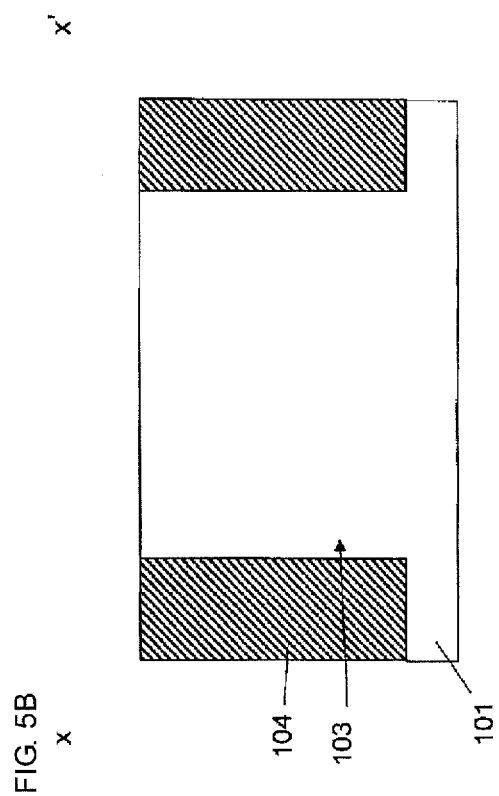
FIG. 5B is a sectional view taken along line X-X' in FIG. 5A.

As illustrated in FIGS. 5A to 5C, a first insulating film 104 is deposited around the fin-shaped silicon layer 103. The first insulating film 104 may be an oxide film formed with high-density plasma or an oxide film formed by low-pressure CVD (Chemical Vapor Deposition).

As illustrated in FIGS. 6A to 6C, the first insulating film 104 is subjected to etch back to expose an upper portion of the fin-shaped silicon layer 103. The step having been described is the same as in a method for producing a fin-shaped silicon layer described in IEDM2010 C C. Wu, et. al, 27.1.1-27.1.4.

Thus, what has been described is the first step of forming a fin-shaped semiconductor layer on a semiconductor substrate and forming a first insulating film around the fin-shaped semiconductor layer.

Next, the following is a description of a second step of forming a second insulating film around the fin-shaped semiconductor layer; depositing a first polysilicon on the second insulating film to achieve planarization; forming, in a direction perpendicular to a direction of the fin-shaped semiconductor layer, a second resist for forming a first gate line and a first pillar-shaped semiconductor layer and a third resist for forming a first contact line and a second pillar-shaped semiconductor layer; and etching the first polysilicon, the second insulating film, and the fin-shaped semiconductor layer to form the first pillar-shaped semiconductor layer, a first dummy gate formed from the first polysilicon, the second pillar-shaped semiconductor layer, and a second dummy gate formed from the first polysilicon.

Figure 7A:
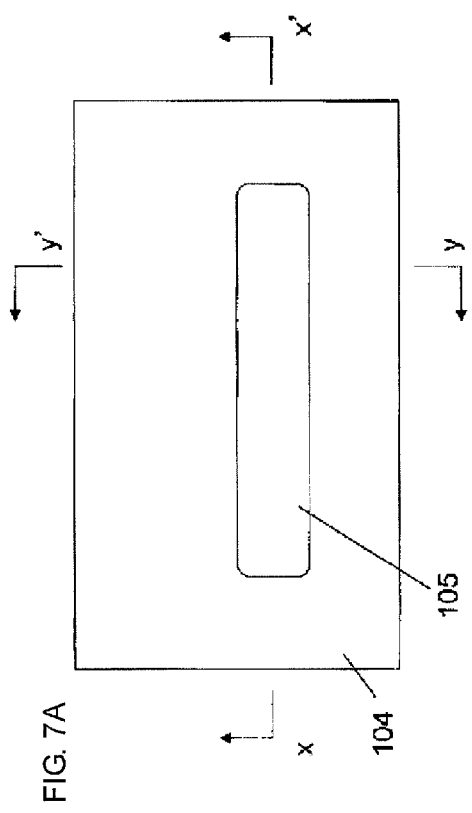
FIG. 7A is a plan view relating to a method for producing a semiconductor device according to an embodiment of the present invention.
Figure 7C:
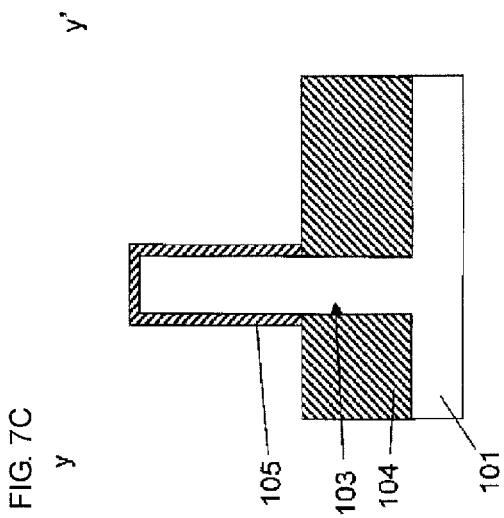
FIG. 7C is a sectional view taken along line Y-Y' in FIG. 7A.
Figure 7B:
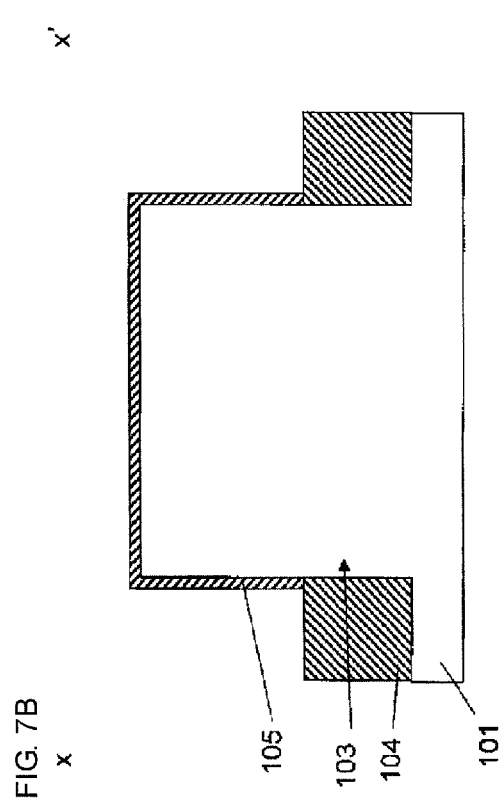
FIG. 7B is a sectional view taken along line X-X' in FIG. 7A.

As illustrated in FIGS. 7A to 7C, a second insulating film 105 is formed around the fin-shaped silicon layer 103. The second insulating film 105 is preferably an oxide film.

Figure 8A:
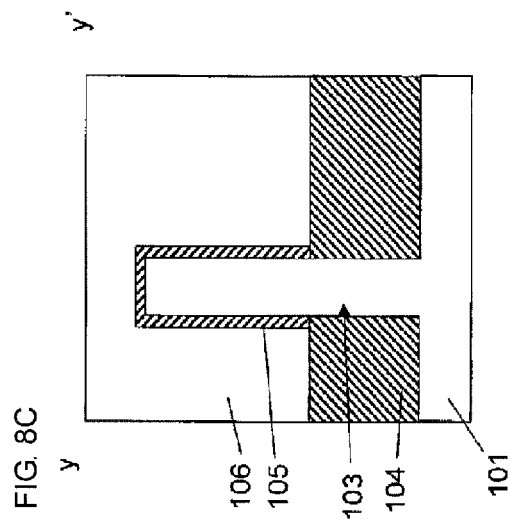
FIG. 8A is a plan view relating to a method for producing a semiconductor device according to an embodiment of the present invention.
Figure 8B:
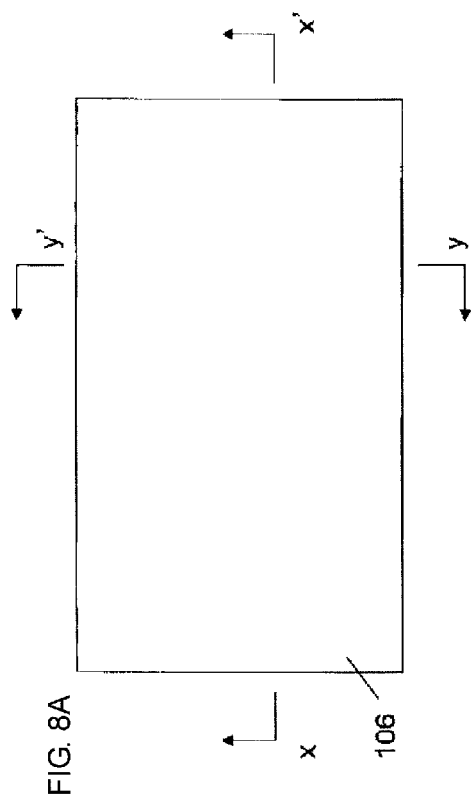
FIG. 8B is a sectional view taken along line X-X' in FIG. 8A.
Figure 8C:
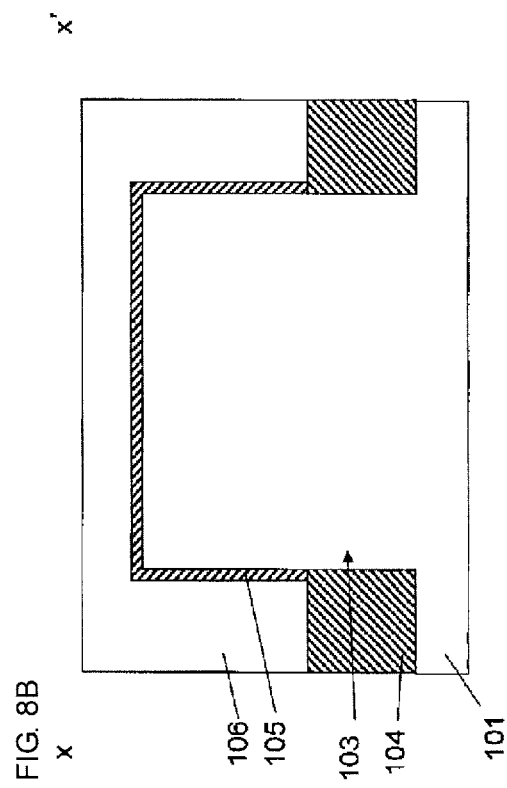
FIG. 8C is a sectional view taken along line Y-Y' in FIG. 8A.

As illustrated in FIGS. 8A to 8C, a first polysilicon 106 is deposited on the second insulating film 105 to achieve planarization.

As illustrated in FIGS. 9A to 9C, a third insulating film 107 is formed on the first polysilicon 106. The third insulating film 107 is preferably a nitride film.

As illustrated in FIGS. 10A to 10C, in a direction perpendicular to a direction of the fin-shaped silicon layer 103, a second resist 108 for forming a gate line and a first pillar-shaped silicon layer and a third resist 109 for forming a first contact line and a second pillar-shaped silicon layer are formed.

As illustrated in FIGS. 11A to 11C, the third insulating film 107, the first polysilicon 106, the second insulating film 105, and the fin-shaped silicon layer 103 are etched to form a first pillar-shaped silicon layer 111, a first dummy gate 115 formed from the first polysilicon, a second pillar-shaped silicon layer 110, and a second dummy gate 114 formed from the first polysilicon. At this time, the third insulating film is divided into third insulating films 113 and 112. Also, the second insulating film is divided into second insulating films 117 and 116. During the etching, in a case where the second resist 108 and the third resist 109 are removed, the third insulating films 113 and 112 function as hard masks. In another case where the second resist is not removed during etching, the third insulating film may be omitted.

As illustrated in FIGS. 12A to 12C, the second resist 108 and the third resist 109 are removed.

Thus, what has been described is the second step of forming a second insulating film around the fin-shaped semiconductor layer; depositing a first polysilicon on the second insulating film to achieve planarization; forming, in a direction perpendicular to a direction of the fin-shaped semiconductor layer, a second resist for forming a first gate line and a first pillar-shaped semiconductor layer and a third resist for forming a first contact line and a second pillar-shaped semiconductor layer; and etching the first polysilicon, the second insulating film, and the fin-shaped semiconductor layer to form the first pillar-shaped semiconductor layer, a first dummy gate formed from the first polysilicon, the second pillar-shaped semiconductor layer, and a second dummy gate formed from the first polysilicon.

Next, the following is a description of a third step of, after the second step, forming a fourth insulating film around the first pillar-shaped semiconductor layer, the second pillar-shaped semiconductor layer, the first dummy gate, and the second dummy gate; depositing a second polysilicon around the fourth insulating film; and etching the second polysilicon so as to remain on side walls of the first dummy gate, the first pillar-shaped semiconductor layer, the second dummy gate, and the second pillar-shaped semiconductor layer to form a third dummy gate and a fourth dummy gate.

Figure 13C:
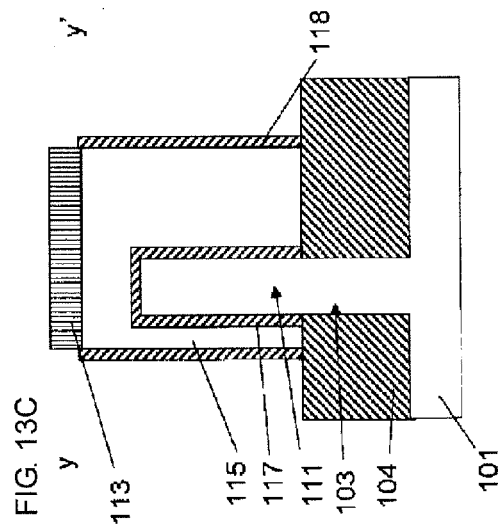
FIG. 13C is a sectional view taken along line Y-Y' in FIG. 13A.
Figure 13A:
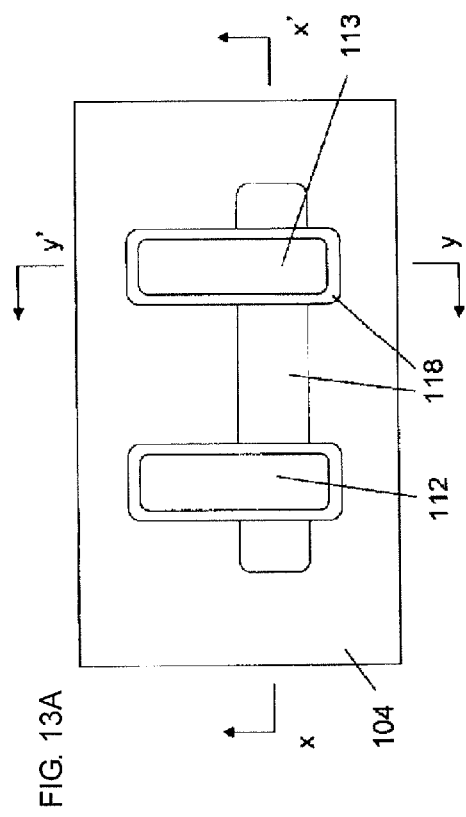
FIG. 13A is a plan view relating to a method for producing a semiconductor device according to an embodiment of the present invention.
Figure 13B:
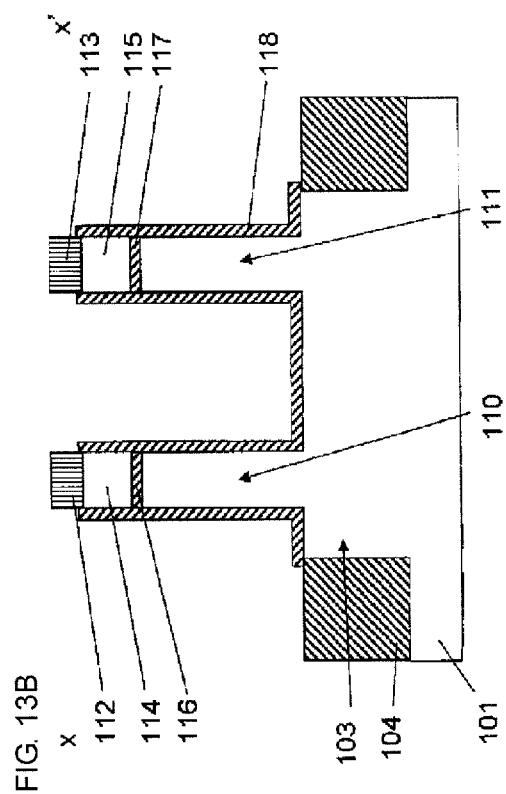
FIG. 13B is a sectional view taken along line X-X' in FIG. 13A.

As illustrated in FIGS. 13A to 13C, a fourth insulating film 118 is formed around the first pillar-shaped silicon layer 111, the second pillar-shaped silicon layer 110, the first dummy gate 115, and the second dummy gate 114. The fourth insulating film 118 is preferably an oxide film.

Figure 14A:
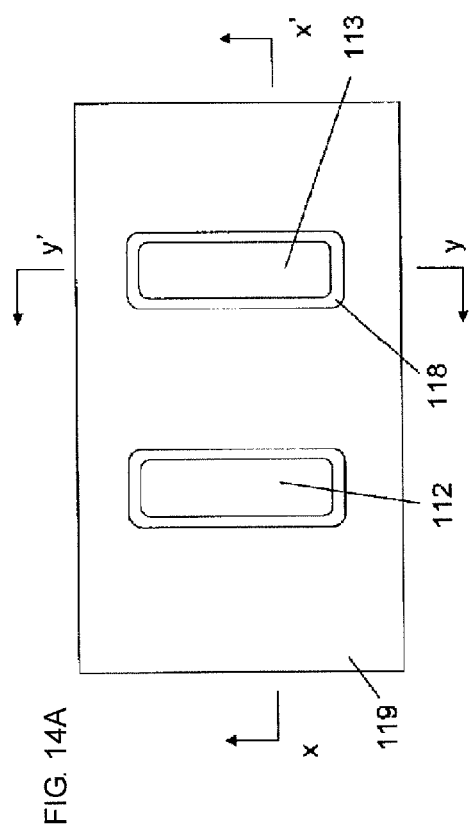
FIG. 14A is a plan view relating to a method for producing a semiconductor device according to an embodiment of the present invention.
Figure 14C:
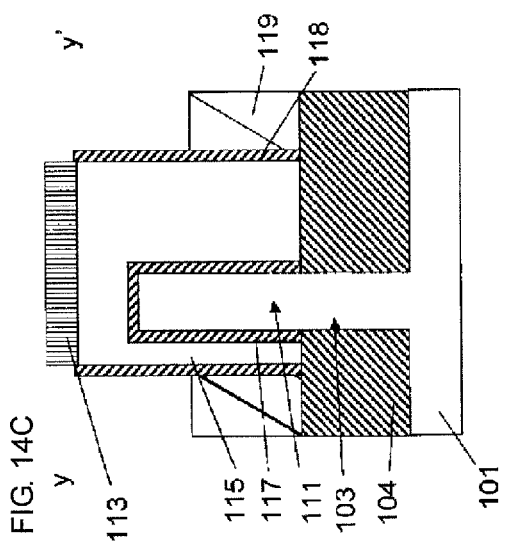
FIG. 14C is a sectional view taken along line Y-Y' in FIG. 14A.
Figure 14B:
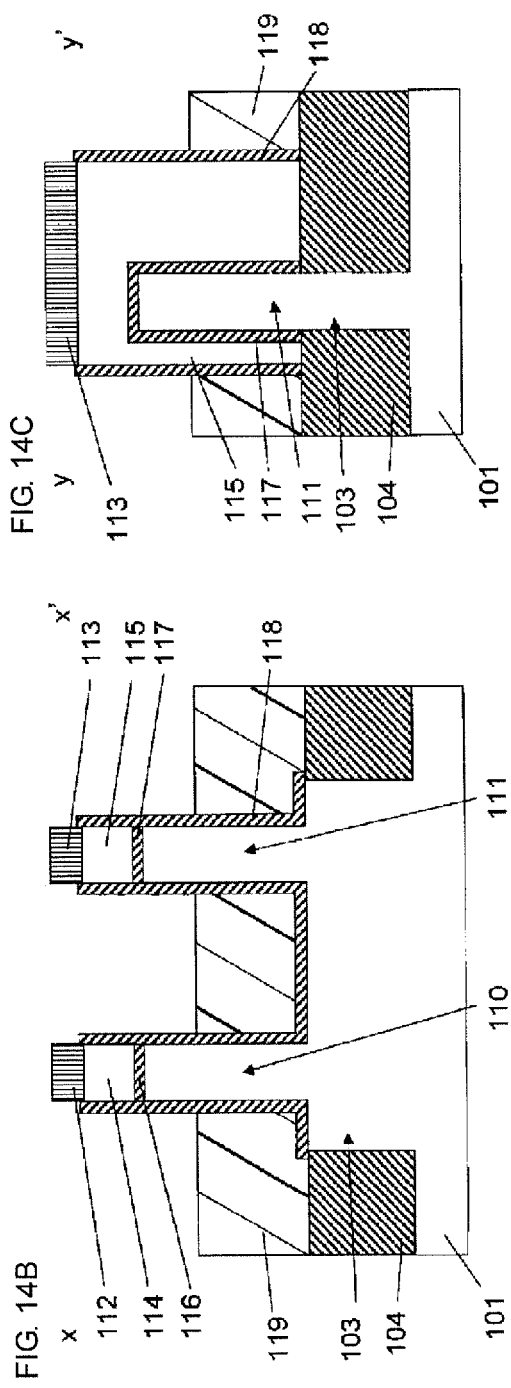
FIG. 14B is a sectional view taken along line X-X' in FIG. 14A.

As illustrated in FIGS. 14A to 14C, a fourth resist 119 is formed and subjected to etch back to expose an upper portion of the first pillar-shaped silicon layer 111. At this time, an upper portion of the second pillar-shaped silicon layer 110 may be exposed.

As illustrated in FIGS. 15A to 15C, an impurity is introduced to form a first diffusion layer 121 in the upper portion of the first pillar-shaped silicon layer 111. A second diffusion layer 120 may be formed in an upper portion of the second pillar-shaped silicon layer 110. In order to form an n-type diffusion layer, arsenic or phosphorus is preferably introduced. In order to form a p-type diffusion layer, boron is preferably introduced.

As illustrated in FIGS. 16A to 16C, the fourth resist 119 is removed.

As illustrated in FIGS. 17A to 17C, a second polysilicon 122 is deposited around the fourth insulating film 118.

As illustrated in FIGS. 18A to 18C, the second polysilicon 118 is etched so as to remain on side walls of the first dummy gate 115, the first pillar-shaped silicon layer 111, the second dummy gate 114, and the second pillar-shaped silicon layer 110 to form a third dummy gate 124 and a fourth dummy gate 123. At this time, the fourth insulating film may be divided into fourth insulating films 126 and 125.

Thus, what has been described is the third step of, after the second step, forming a fourth insulating film around the first pillar-shaped semiconductor layer, the second pillar-shaped semiconductor layer, the first dummy gate, and the second dummy gate; depositing a second polysilicon around the fourth insulating film; and etching the second polysilicon so as to remain on side walls of the first dummy gate, the first pillar-shaped semiconductor layer, the second dummy gate, and the second pillar-shaped semiconductor layer to form a third dummy gate and a fourth dummy gate.

Next, the following is a description of a fourth step of forming a third diffusion layer in an upper portion of the fin-shaped semiconductor layer, in a lower portion of the first pillar-shaped semiconductor layer, and in a lower portion of the second pillar-shaped semiconductor layer; forming a fifth insulating film around the third dummy gate and the fourth dummy gate; etching the fifth insulating film so as to have a sidewall shape to form sidewalls formed of the fifth insulating film; and forming a metal-semiconductor compound on the third diffusion layer.

As illustrated in FIGS. 19A to 19C, an impurity is introduced to form a third diffusion layer 127 in a lower portion of the first pillar-shaped silicon layer 111 and in a lower portion of the second pillar-shaped silicon layer 110. In order to form an n-type diffusion layer, arsenic or phosphorus is preferably introduced. In order to form a p-type diffusion layer, boron is preferably introduced. The diffusion layer may be formed after formation of sidewalls formed of a fifth insulating film described later on.

As illustrated in FIGS. 20A to 20C, a fifth insulating film 128 is formed around the third dummy gate 124 and the fourth dummy gate 123. The fifth insulating film 128 is preferably a nitride film.

Figure 21C:
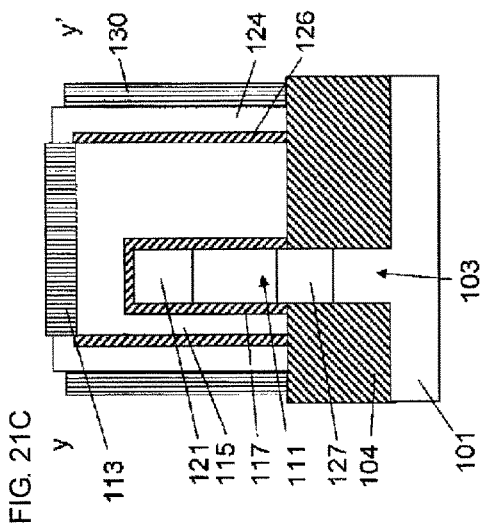
FIG. 21C is a sectional view taken along line Y-Y' in FIG. 21A.
Figure 21A:
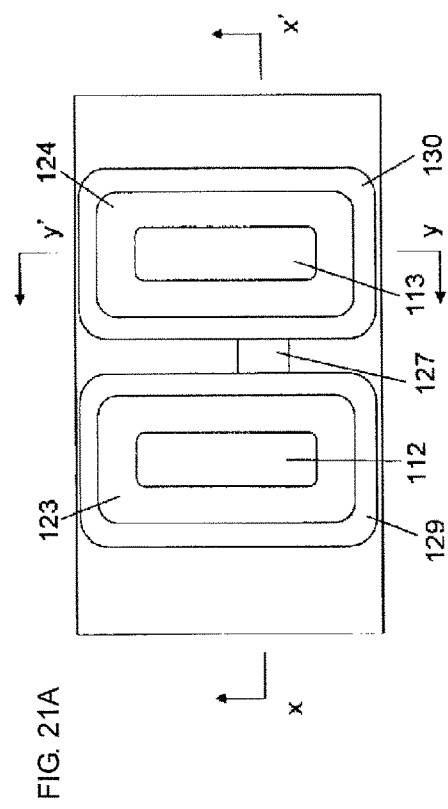
FIG. 21A is a plan view relating to a method for producing a semiconductor device according to an embodiment of the present invention.
Figure 21B:
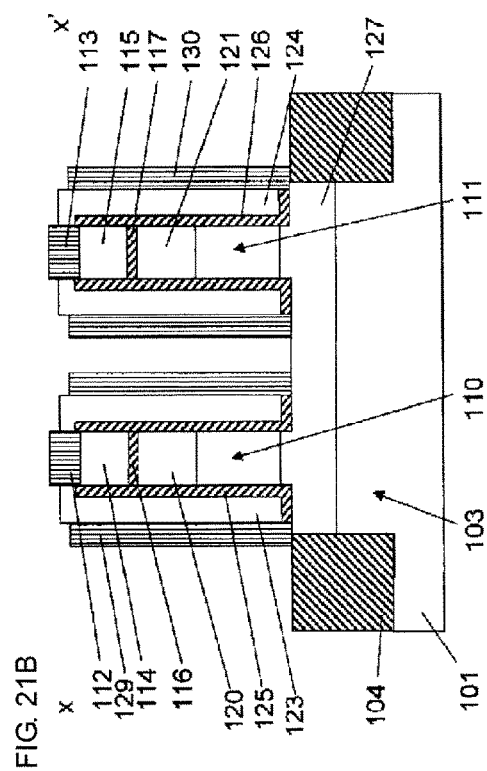
FIG. 21B is a sectional view taken along line X-X' in FIG. 21A.

As illustrated in FIGS. 21A to 21C, the fifth insulating film 128 is etched so as to have a sidewall shape to form sidewalls 130 and 129 formed of the fifth insulating film.

Figure 22C:
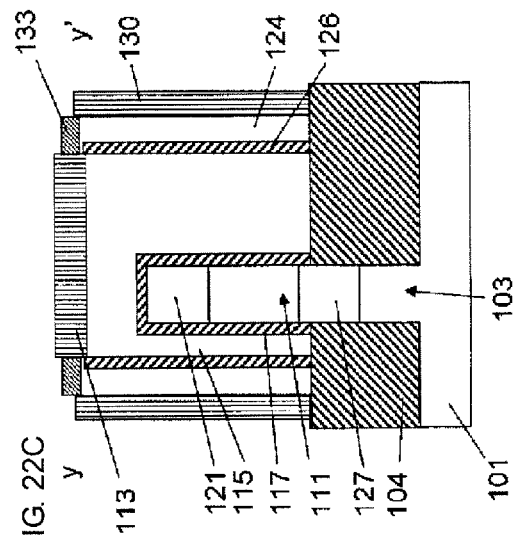
FIG. 22C is a sectional view taken along line Y-Y' in FIG. 22A.
Figure 22A:
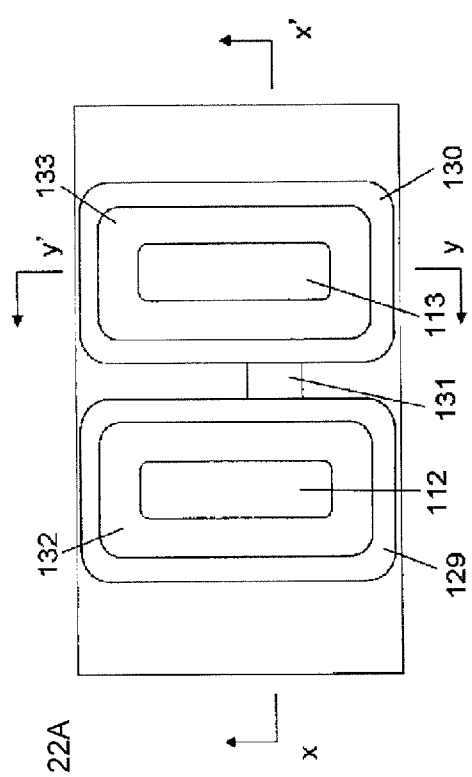
FIG. 22A is a plan view relating to a method for producing a semiconductor device according to an embodiment of the present invention.
Figure 22B:
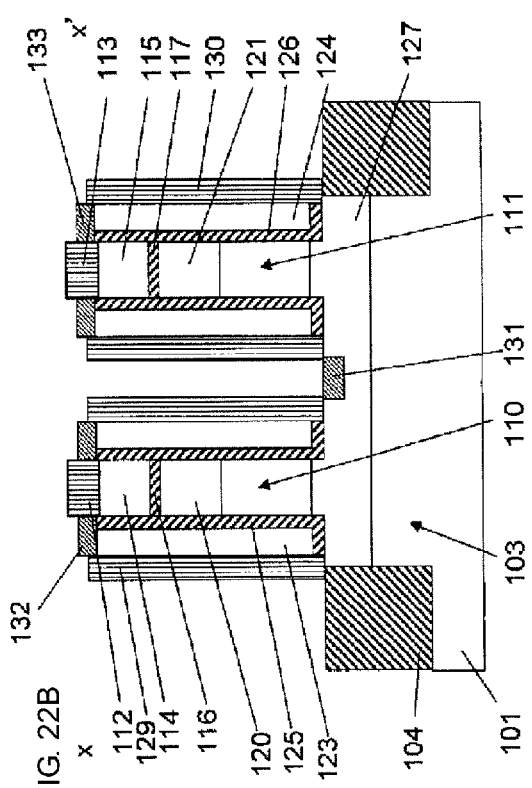
FIG. 22B is a sectional view taken along line X-X' in FIG. 22A.

As illustrated in FIGS. 22A to 22C, a metal-semiconductor compound 131 is formed on the third diffusion layer 127.

At this time, metal-semiconductor compounds 133 and 132 are also formed in an upper portion of the third dummy gate 124 and in an upper portion of the fourth dummy gate 125.

Thus, what has been described is the fourth step of forming a third diffusion layer in an upper portion of the fin-shaped semiconductor layer, in a lower portion of the first pillar-shaped semiconductor layer, and in a lower portion of the second pillar-shaped semiconductor layer; forming a fifth insulating film around the third dummy gate and the fourth dummy gate; etching the fifth insulating film so as to have a sidewall shape to form sidewalls formed of the fifth insulating film; and forming a metal-semiconductor compound on the third diffusion layer.

Next, the following is a description of a fifth step of, after the fourth step, depositing an interlayer insulating film; performing chemical mechanical polishing to expose upper portions of the first dummy gate, the second dummy gate, the third dummy gate, and the fourth dummy gate; removing the first dummy gate, the second dummy gate, the third dummy gate, and the fourth dummy gate; removing the second insulating film and the fourth insulating film; forming a gate insulating film around the first pillar-shaped semiconductor layer, around the second pillar-shaped semiconductor layer, and on inner sides of the fifth insulating film; forming a fifth resist for removing the gate insulating film from around a bottom portion of the second pillar-shaped semiconductor layer; removing the gate insulating film from around the bottom portion of the second pillar-shaped semiconductor layer; depositing metal; and subjecting the metal to etch back to form a gate electrode and a gate line around the first pillar-shaped semiconductor layer and to form a contact electrode and a contact line around the second pillar-shaped semiconductor layer.

As illustrated in FIGS. 23A to 23C, an interlayer insulating film 134 is deposited. The interlayer insulating film 134 may be a contact stopper film.

Figure 24C:
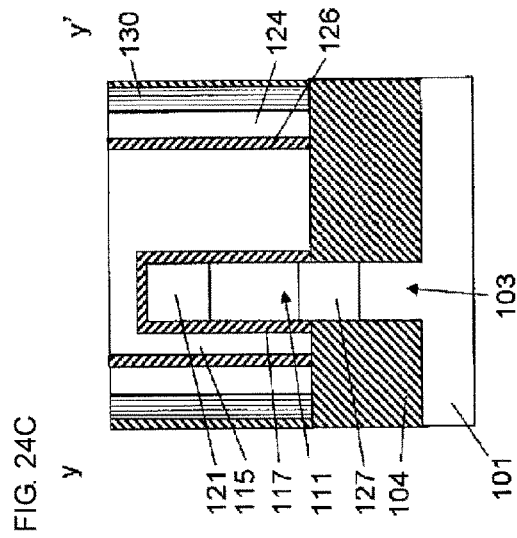
FIG. 24C is a sectional view taken along line Y-Y' in FIG. 24A.
Figure 24A:
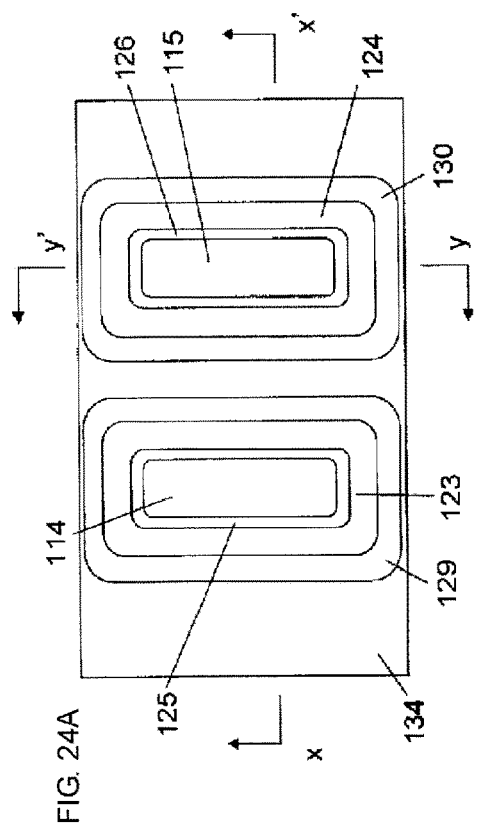
FIG. 24A is a plan view relating to a method for producing a semiconductor device according to an embodiment of the present invention.
Figure 24B:
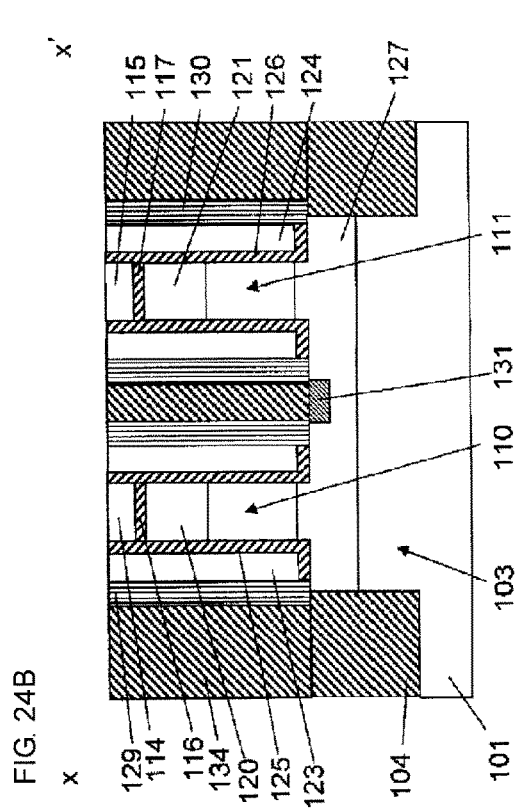
FIG. 24B is a sectional view taken along line X-X' in FIG. 24A.

As illustrated in FIGS. 24A to 24C, chemical mechanical polishing is performed to expose upper portions of the first dummy gate 115, the second dummy gate 114, the third dummy gate 124, and the fourth dummy gate 123. At this time, the metal-semiconductor compounds 133 and 132 in the upper portion of the third dummy gate 124 and in the upper portion of the fourth dummy gate 125 are also removed.

Figure 25C:
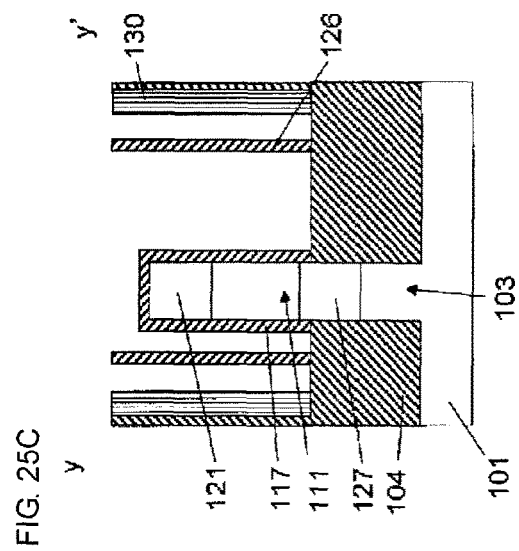
FIG. 25C is a sectional view taken along line Y-Y' in FIG. 25A.
Figure 25A:
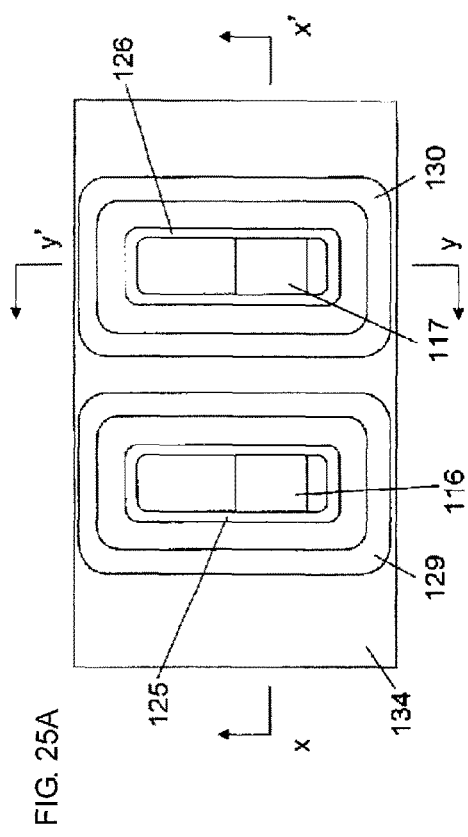
FIG. 25A is a plan view relating to a method for producing a semiconductor device according to an embodiment of the present invention.
Figure 25B:
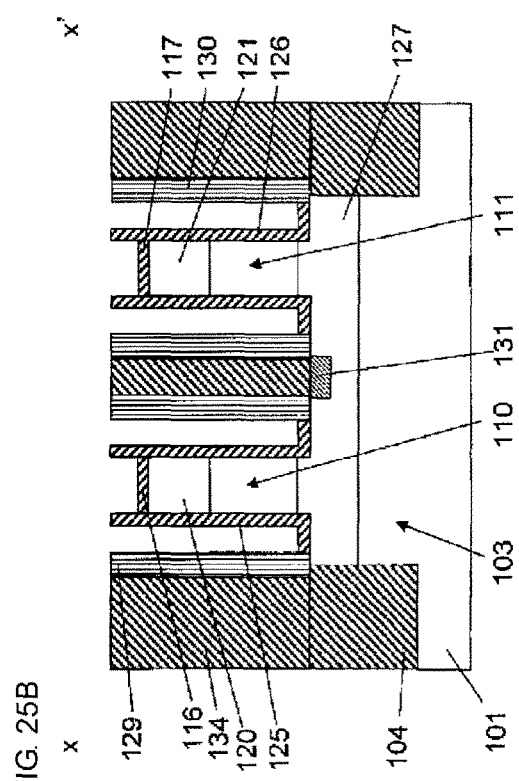
FIG. 25B is a sectional view taken along line X-X' in FIG. 25A.

As illustrated in FIGS. 25A to 25C, the first dummy gate 115, the second dummy gate 114, the third dummy gate 124, and the fourth dummy gate 123 are removed.

As illustrated in FIGS. 26A to 26C, the second insulating films 117 and 116 and the fourth insulating films 126 and 125 are removed.

Figure 27A:
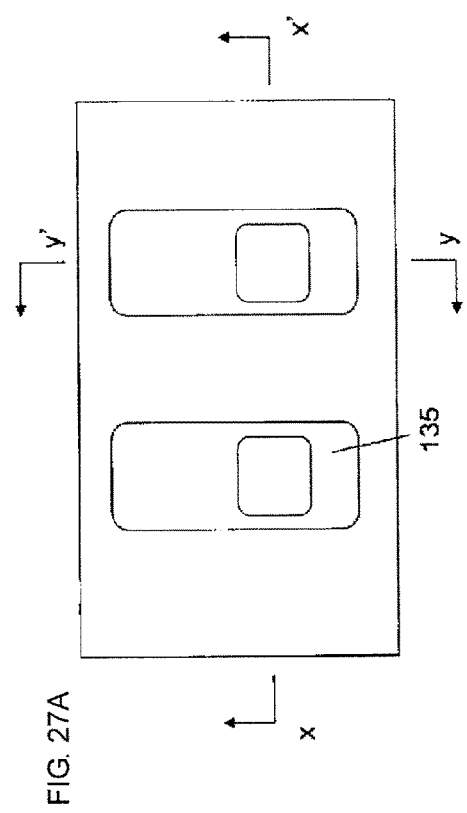
FIG. 27A is a plan view relating to a method for producing a semiconductor device according to an embodiment of the present invention.
Figure 27C:
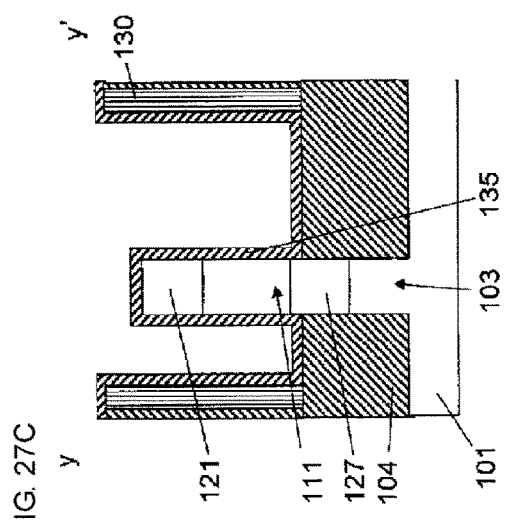
FIG. 27C is a sectional view taken along line Y-Y' in FIG. 27A.
Figure 27B:
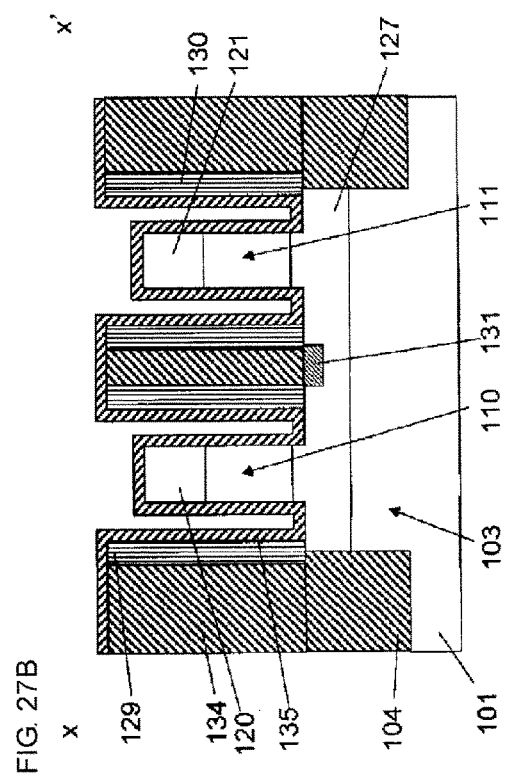
FIG. 27B is a sectional view taken along line X-X' in FIG. 27A.

As illustrated in FIGS. 27A to 27C, a gate insulating film 135 is formed around the first pillar-shaped silicon layer 111, around the second pillar-shaped silicon layer 110, and on inner sides of the fifth insulating films 130 and 129.

As illustrated in FIGS. 28A to 28C, a fifth resist 136 for removing the gate insulating film 135 from around a bottom portion of the second pillar-shaped silicon layer 110 is formed.

Figure 29C:
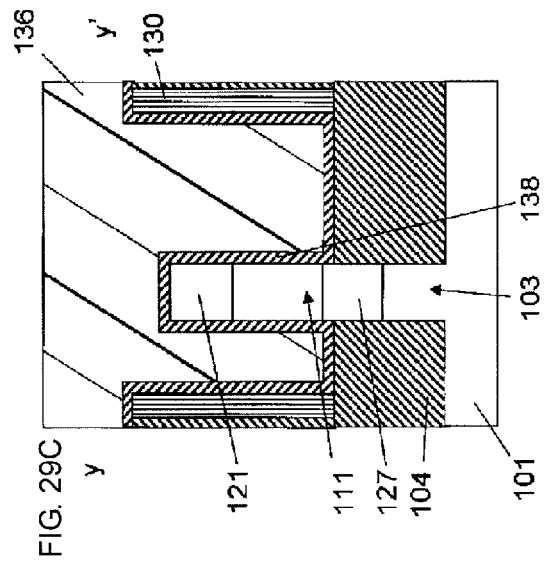
FIG. 29C is a sectional view taken along line Y-Y' in FIG. 29A.
Figure 29A:
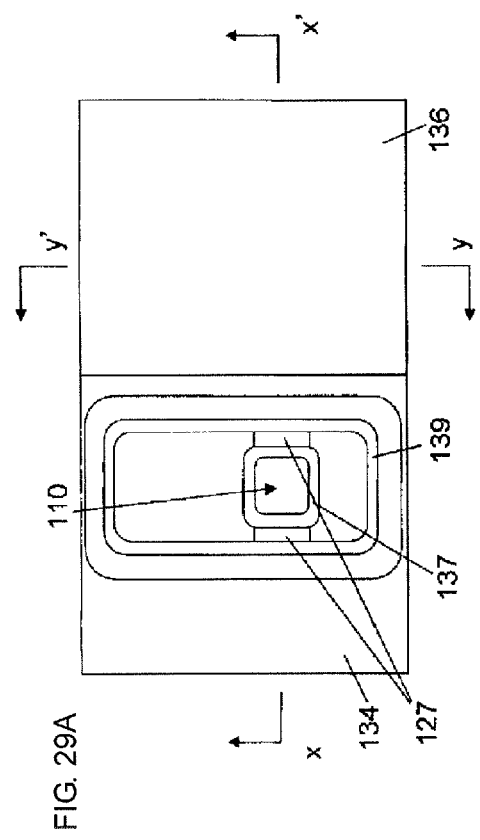
FIG. 29A is a plan view relating to a method for producing a semiconductor device according to an embodiment of the present invention.
Figure 29B:
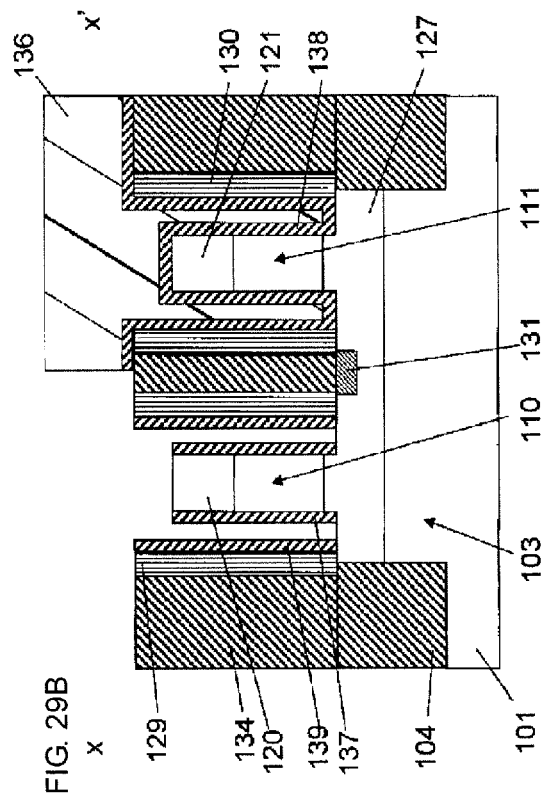
FIG. 29B is a sectional view taken along line X-X' in FIG. 29A.

As illustrated in FIGS. 29A to 29C, the gate insulating film 135 is removed from around the bottom portion of the second pillar-shaped silicon layer 110. The gate insulating film is divided into gate insulating films 137, 139, and 138. The gate insulating films 137 and 139 may be removed by isotropic etching.

As illustrated in FIGS. 30A to 30C, the fifth resist 136 is removed.

As illustrated in FIGS. 31A to 31C, metal 140 is deposited.

Figure 32A:
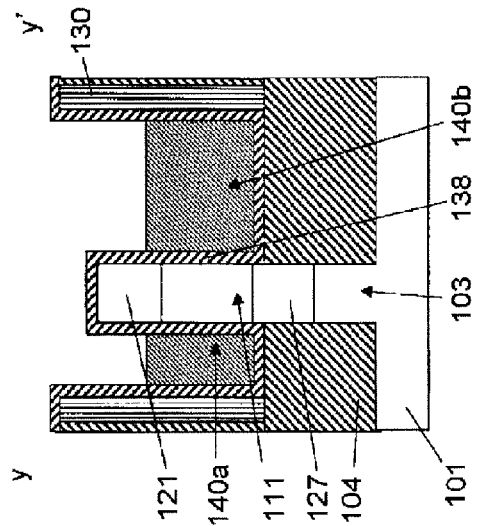
FIG. 32A is a plan view relating to a method for producing a semiconductor device according to an embodiment of the present invention.
Figure 32B:
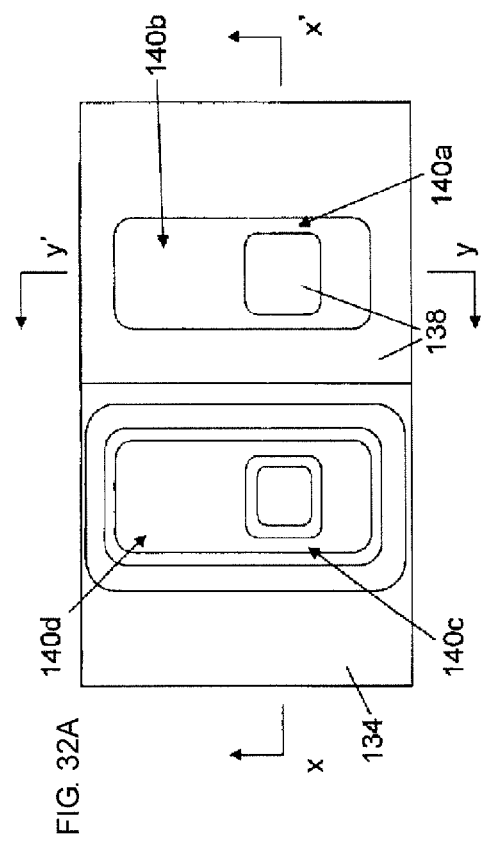
FIG. 32B is a sectional view taken along line X-X' in FIG. 32A.
Figure 32C:
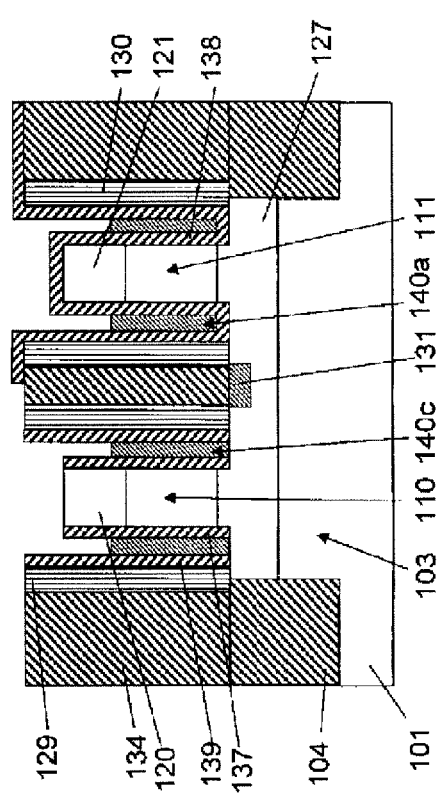
FIG. 32C is a sectional view taken along line Y-Y' in FIG. 32A.

As illustrated in FIGS. 32A to 32C, the metal 140 is subjected to etch back to form a gate electrode 140a and a gate line 140b around the first pillar-shaped silicon layer 111 and to form a contact electrode 140c and a contact line 140d around the second pillar-shaped silicon layer 110. The length of the contact line may be short.

Thus, what has been described is the fifth step of; after the fourth step, depositing an interlayer insulating film, performing chemical mechanical polishing to expose upper portions of the first dummy gate, the second dummy gate, the third dummy gate, and the fourth dummy gate; removing the first dummy gate, the second dummy gate, the third dummy gate, and the fourth dummy gate; removing the second insulating film and the fourth insulating film; forming a gate insulating film around the first pillar-shaped semiconductor layer, around the second pillar-shaped semiconductor layer, and on inner sides of the fifth insulating film; forming a fifth resist for removing the gate insulating film from around a bottom portion of the second pillar-shaped semiconductor layer; removing the gate insulating film from around the bottom portion of the second pillar-shaped semiconductor layer; depositing metal; and subjecting the metal to etch back to form a gate electrode and a gate line around the first pillar-shaped semiconductor layer and to form a contact electrode and a contact line around the second pillar-shaped semiconductor layer.

Figure 33C:
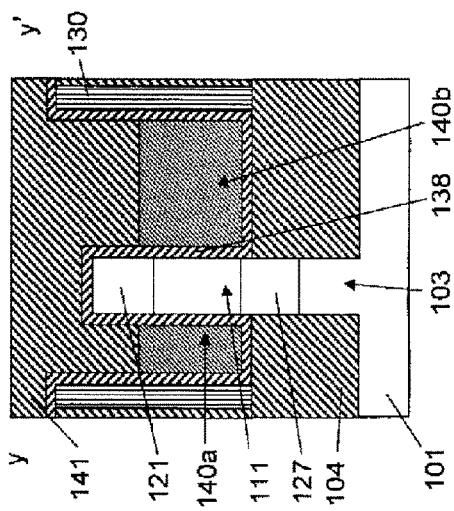
FIG. 33C is a sectional view taken along line Y-Y' in FIG. 33A.
Figure 33A:
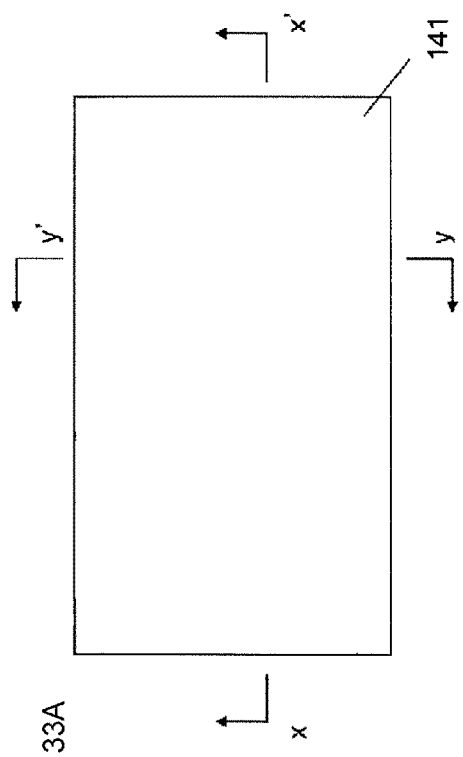
FIG. 33A is a plan view relating to a method for producing a semiconductor device according to an embodiment of the present invention.
Figure 33B:
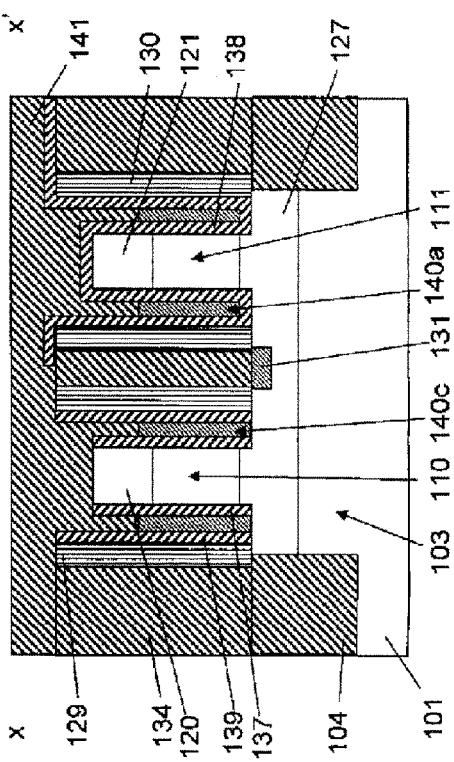
FIG. 33B is a sectional view taken along line X-X' in FIG. 33A.

As illustrated in FIGS. 33A to 33C, an oxide film 141 is deposited.

As illustrated in FIGS. 34A to 34C, a sixth resist 142 for forming contact holes is formed.

As illustrated in FIGS. 35A to 35C, the oxide film 141 is etched to form contact holes 144 and 143. At this time, the contact hole 143 is formed so as to extend to the contact electrode 140c and the contact line 140d. Accordingly, this contact hole is shallow, compared with a case of forming a contact hole by etching so as to extend from the top of the oxide film 141 to the top of the third diffusion layer 127 in the upper portion of the fin-shaped silicon layer 103.

As illustrated in FIGS. 36A to 36C, the sixth resist 142 is removed.

As illustrated in FIGS. 37A to 37C, a seventh resist 145 for forming a contact hole is formed.

As illustrated in FIGS. 38A to 38C, the oxide film 141 and the gate insulating film 138 are etched to form a contact hole 146.

As illustrated in FIGS. 39A to 39C, the seventh resist 145 is removed.

As illustrated in FIGS. 40A to 40C, metal 147 is deposited to form contacts 148, 149, and 150.

As illustrated in FIGS. 41A to 41C, eighth resists 151, 152, and 153 for forming metal wirings are formed.

As illustrated in FIGS. 42A to 42C, the metal 147 is etched to form metal wirings 154, 155, and 156.

As illustrated in FIGS. 43A to 43C, the eighth resists 151, 152, and 153 are removed.

Thus, what has been described is a method for producing an SGT by a gate-last process in which a gate electrode and a gate line are formed around a first pillar-shaped semiconductor layer and simultaneously a contact electrode and a contact line that are connected to an upper portion of a fin-shaped semiconductor layer are formed around a second pillar-shaped semiconductor layer.

FIGS. 1A to 1C illustrate the structure of a semiconductor device obtained by the above-described production method.

This semiconductor device includes a fin-shaped silicon layer 103 formed on a silicon substrate 101, a first insulating film 104 formed around the fin-shaped silicon layer 103, a second pillar-shaped silicon layer 110 formed on the fin-shaped silicon layer 103, a contact electrode 140c formed of metal and formed around the second pillar-shaped silicon layer 110, a contact line 140d formed of metal and extending in a direction perpendicular to the fin-shaped silicon layer 103 connected to the contact electrode 140c, and a third diffusion layer 127 formed in an upper portion of the fin-shaped silicon layer 103 and in a lower portion of the second pillar-shaped silicon layer 110, wherein the contact electrode 140c is connected to the third diffusion layer 127.

The semiconductor device further includes a gate insulating film 137 formed between the second pillar-shaped silicon layer 110 and the contact electrode 140c.

In the semiconductor device, the width of the second pillar-shaped silicon layer 110 in a direction orthogonal to the fin-shaped silicon layer is equal to the width of the fin-shaped silicon layer 103 in the direction orthogonal to the fin-shaped silicon layer 103.

In the semiconductor device, the gate insulating film is formed around the contact electrode and the contact line.

In the semiconductor device, the outer width of the contact electrode is equal to the width of the contact line.

The semiconductor device includes the fin-shaped silicon layer 103 formed on the silicon substrate 101, the first insulating film 104 formed around the fin-shaped silicon layer 103, a first pillar-shaped silicon layer 111 formed on the fin-shaped silicon layer 103, the first pillar-shaped silicon layer 111 having a width in a direction orthogonal to the fin-shaped silicon layer, the width being equal to the width of the fin-shaped silicon layer 103 in the direction orthogonal to the fin-shaped silicon layer 103, a gate insulating film 138 formed around the first pillar-shaped silicon layer 111, a gate electrode 140a formed of metal and formed around the gate insulating film 138, a gate line 140b formed of metal and extending in a direction orthogonal to the fin-shaped silicon layer 103 connected to the gate electrode 140a, the gate insulating film 138 formed around and below the gate electrode 140a and the gate line 140b, the gate electrode 140a having an outer width being equal to the width of the gate line 140b, a first diffusion layer 121 formed in an upper portion of the first pillar-shaped silicon layer 111, and the third diffusion layer 127 formed in an upper portion of the fin-shaped silicon layer 103 and in a lower portion of the pillar-shaped silicon layer 111.

This structure including the second pillar-shaped silicon layer 110 and the contact electrode 140c and the contact line that are formed around the second pillar-shaped silicon layer 110 is the same as a transistor structure except that the contact electrode 140c is connected to the third diffusion layer. Thus, reduction in the number of steps can be achieved.

Note that the present invention encompasses various embodiments and modifications without departing from the broad spirit and scope of the present invention. The above-described embodiment is used to describe an example of the present invention and does not limit the scope of the present invention.

For example, a method for producing a semiconductor device in which the p-type (including p+ type) and the n-type (including n+ type) in the above-described embodiment are changed to the opposite conductivity types and a semiconductor device produced by this method are obviously within the technical scope of the present invention.

What is claimed is:

1. A semiconductor device comprising:
   a fin-shaped semiconductor layer on a semiconductor substrate,
   a first insulating film around the fin-shaped semiconductor layer,
   a second pillar-shaped semiconductor layer on the fin-shaped semiconductor layer,
   a metal contact electrode around the second pillar-shaped semiconductor layer,
   a metal contact line extending in an orthogonal direction to that of the fin-shaped semiconductor layer and connected to the metal contact electrode, and
   a third diffusion layer in an upper portion of the fin-shaped semiconductor layer and in a lower portion of the second pillar-shaped semiconductor layer,
   wherein the contact electrode is connected to the third diffusion layer.

2. The semiconductor device according to claim 1, further comprising a gate insulating film between the second pillar-shaped semiconductor layer and the contact electrode.

3. The semiconductor device according to claim 1, wherein a width of the second pillar-shaped semiconductor layer in the orthogonal direction is equal to a width of the fin-shaped semiconductor layer in the orthogonal direction.

4. The semiconductor device according to claim 2, wherein the gate insulating film is around the contact electrode and the contact line.

5. The semiconductor device according to claim 1, wherein an outer width of the contact electrode is equal to a width of the contact line.

6. The semiconductor device according to claim 1, comprising:
   the fin-shaped semiconductor layer on the semiconductor substrate,
   the first insulating film around the fin-shaped semiconductor layer,
   a first pillar-shaped semiconductor layer on the fin-shaped semiconductor layer, the first pillar-shaped semiconductor layer having a width in the orthogonal direction, the width equal to a width of the fin-shaped semiconductor layer in the orthogonal direction,
   a gate insulating film around the first pillar-shaped semiconductor layer,
   a gate electrode of metal and formed around the gate insulating film,
   a gate line of metal and extending in the orthogonal direction and connected to the gate electrode,
   the gate insulating film around and below the gate electrode and the gate line,
   the gate electrode having an outer width equal to a width of the gate line,
   a first diffusion layer in an upper portion of the first pillar-shaped semiconductor layer, and
   the third diffusion layer in an upper portion of the fin-shaped semiconductor layer and in a lower portion of the first pillar-shaped semiconductor layer.

* * * * *